(12) United States Patent
Tuers et al.

(10) Patent No.: US 9,780,809 B2
(45) Date of Patent: Oct. 3, 2017

(54) TRACKING AND USE OF TRACKED BIT VALUES FOR ENCODING AND DECODING DATA IN UNRELIABLE MEMORY

(71) Applicant: SanDisk Technologies Inc., Plano, TX (US)

(72) Inventors: Daniel Tuers, Kapaa, HI (US); Abhijeet Manohar, Bangalore (IN); Sujeeth Joseph, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 138 days.

(21) Appl. No.: 14/701,130

(22) Filed: Apr. 30, 2015

(65) Prior Publication Data
US 2016/0322990 A1    Nov. 3, 2016

(51) Int. Cl.
| | |
|---|---|
| H03M 13/45 | (2006.01) |
| G06F 11/10 | (2006.01) |
| G06F 3/06 | (2006.01) |
| H03M 13/29 | (2006.01) |
| H03M 13/37 | (2006.01) |
| G11C 29/52 | (2006.01) |
| G11C 5/04 | (2006.01) |
| G11C 29/04 | (2006.01) |
| G11C 29/44 | (2006.01) |

(52) U.S. Cl.
CPC .......... *H03M 13/45* (2013.01); *G06F 3/0679* (2013.01); *G06F 11/1068* (2013.01); *H03M 13/293* (2013.01); *H03M 13/2909* (2013.01); *H03M 13/2927* (2013.01); *H03M 13/3715* (2013.01); *G11C 5/04* (2013.01); *G11C 29/52* (2013.01); *G11C 2029/0409* (2013.01); *G11C 2029/4402* (2013.01)

(58) Field of Classification Search
CPC ............... G06F 11/1068; G06F 3/0679; G11C 2029/0409; G11C 2029/4402; G11C 29/52; G11C 5/04; H03M 13/2909; H03M 13/2927; H03M 13/293; H03M 13/3715; H03M 13/45
USPC .......................... 714/764, 773, 801; 711/103
See application file for complete search history.

(56) References Cited

U.S. PATENT DOCUMENTS

| | | | |
|---|---|---|---|
| 7,644,336 B2 * | 1/2010 | Yang .................. | H03M 13/1197 375/298 |
| 7,805,662 B2 | 9/2010 | Ma et al. | |
| 7,814,401 B2 | 10/2010 | Alrod et al. | |
| 8,037,394 B2 * | 10/2011 | Djurdjevic ....... | G11B 20/10046 714/780 |
| 8,301,912 B2 | 10/2012 | Lin et al. | |
| 8,885,428 B2 | 11/2014 | Chen et al. | |
| 9,268,635 B2 * | 2/2016 | Sharon ............... | H03M 13/1108 |
| 2006/0023507 A1 | 2/2006 | Mangan et al. | |
| 2007/0089044 A1 * | 4/2007 | Goma ................... | H03M 13/19 714/801 |
| 2009/0003144 A1 * | 1/2009 | Mallary ................ | B82Y 10/00 369/30.21 |

(Continued)

*Primary Examiner* — John J Tabone, Jr.
(74) *Attorney, Agent, or Firm* — Brinks Gilson & Lione

(57) ABSTRACT

A non-volatile memory system may include a tracking module that tracks logic values of bits to be stored in memory elements identified as unreliable. A record of the logic values may be generated. During decoding of the data, a log likelihood ratio module may use the record to assign log likelihood ratio values for the decoding.

26 Claims, 10 Drawing Sheets

(56) References Cited

U.S. PATENT DOCUMENTS

| | | | |
|---|---|---|---|
| 2009/0006931 A1* | 1/2009 | Djurdjevic | G11B 20/10046 714/799 |
| 2012/0166905 A1* | 6/2012 | Myung | H03M 13/1128 714/752 |
| 2012/0260148 A1* | 10/2012 | Hughes | G06F 11/1068 714/773 |
| 2012/0297267 A1* | 11/2012 | Chinnici | H03M 13/1111 714/755 |
| 2014/0126293 A1 | 5/2014 | Tsai et al. | |
| 2014/0133234 A1 | 5/2014 | Conley et al. | |
| 2014/0157087 A1 | 6/2014 | Yurzola et al. | |
| 2014/0219023 A1 | 8/2014 | Li et al. | |
| 2014/0250348 A1 | 9/2014 | Harari et al. | |
| 2014/0269071 A1 | 9/2014 | Pandya et al. | |
| 2015/0046770 A1 | 2/2015 | Luo et al. | |
| 2015/0149855 A1* | 5/2015 | Alhussien | G06F 11/1012 714/758 |
| 2015/0188717 A1* | 7/2015 | Wu | G09C 1/00 380/44 |
| 2015/0234706 A1* | 8/2015 | Alrod | G06F 11/1072 714/704 |
| 2015/0339186 A1* | 11/2015 | Sharon | H03M 13/1108 714/760 |
| 2015/0378801 A1* | 12/2015 | Navon | G06F 11/076 714/704 |
| 2015/0381357 A1* | 12/2015 | Guillaume | H04L 9/0875 380/44 |
| 2016/0034353 A1* | 2/2016 | Tuers | H03M 13/1111 714/764 |
| 2016/0085619 A1* | 3/2016 | Iyer | G06F 11/1004 714/807 |
| 2016/0321000 A1* | 11/2016 | Tuers | G06F 3/0629 |

\* cited by examiner

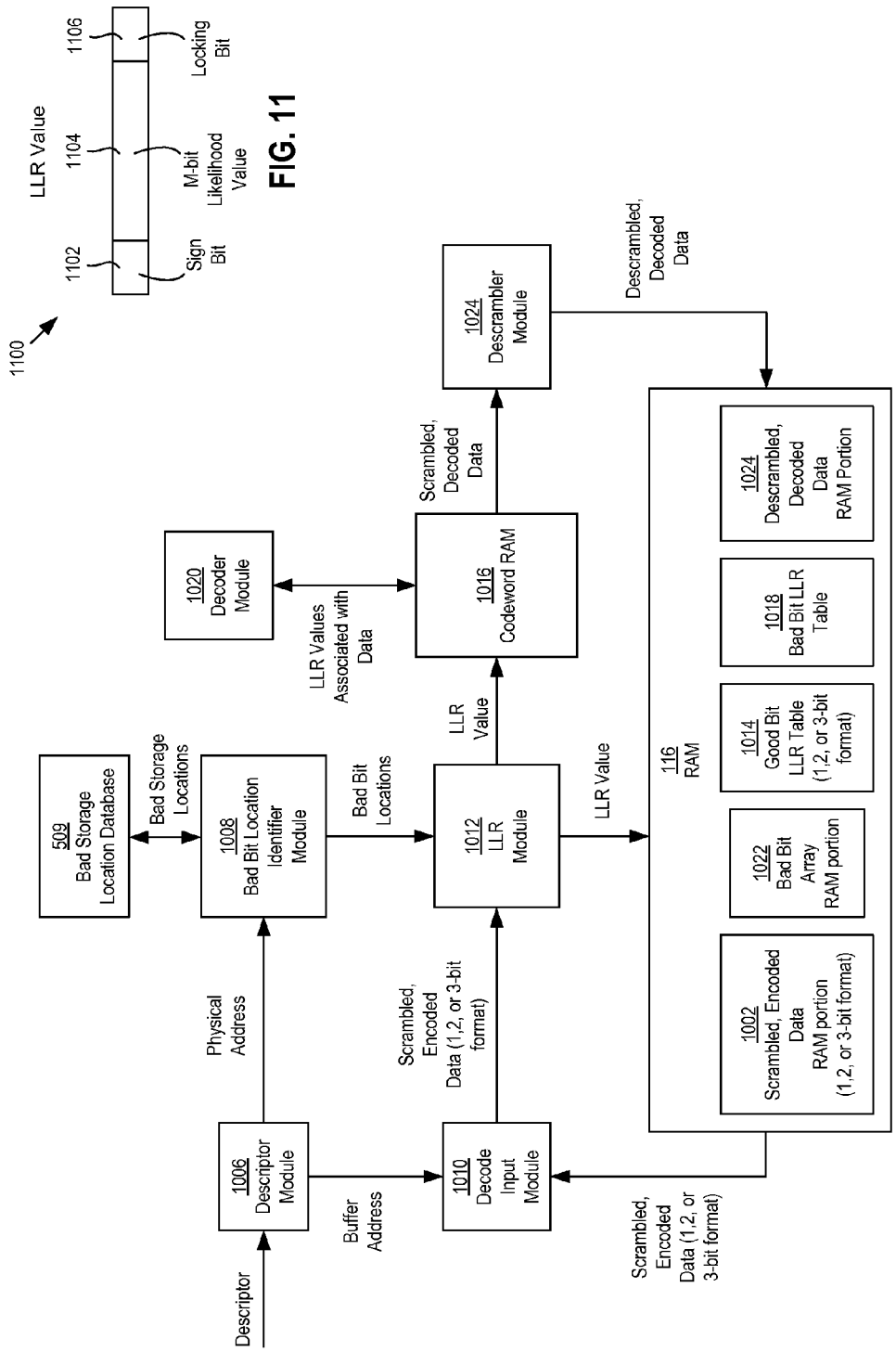

TRACKING AND USE OF TRACKED BIT VALUES FOR ENCODING AND DECODING DATA IN UNRELIABLE MEMORY

BACKGROUND

Memory systems may have memory elements store data unreliably for various reasons, such as due to open circuits, closed circuits, short circuits, retention issues, or disturb problems, as examples. Writing data into known unreliable memory areas may be undesirable as doing so may increase the number of errors that occur when the data is read, which degrades the error correction capability of the controller. However, avoiding writing to the unreliable memory elements altogether may result in significant loss of available storage space. As such, writing to known unreliable memory elements in a way that enhances the error correction capability of the controller may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIG. 10 is a block diagram of exemplary modules of the controller of FIG. 2A used to perform a decoding process.

FIG. 11 is a schematic diagram of an example log likelihood ratio (LLR) value assigned by an LLR module of FIG. 10.

DETAILED DESCRIPTION OF PRESENTLY PREFERRED EMBODIMENTS

Overview

Figure 1A:
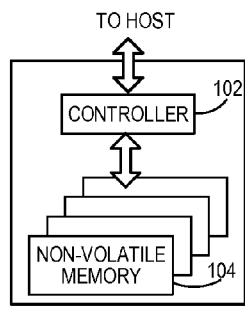
FIG. 1A is a block diagram of an exemplary non-volatile memory system.

By way of introduction, the below embodiments relate to memory systems and methods for encoding and decoding data that includes bits stored in memory elements identified as unreliable. In one embodiment, a non-volatile memory system may include non-volatile memory and a controller. The controller may include a plurality of write modules to write data into the non-volatile memory and a plurality of read modules to read the data from the non-volatile memory. The plurality of write modules may include an unreliable storage location identifier module configured to identify a plurality of memory elements of the non-volatile memory to store the data, and determine which memory elements of the plurality of memory elements are identified in the non-volatile memory system as unreliable. The plurality of write modules may further include a tracking module configured to track logic values of bits of the data to be stored in the identified unreliable memory elements. The plurality of read modules may include a log likelihood ratio module configured to assign log likelihood ratio values to the bits of data stored in the identified unreliable memory elements based on the tracked logic values.

In another embodiment, a method of decoding data stored in non-volatile memory of a non-volatile memory system may be performed. The method may include receiving, with a log likelihood ratio module of a controller of the non-volatile memory system, a plurality of bit representations associated with the data stored in the non-volatile memory. In addition, the method may include: in response to receiving the plurality of bit representations, assigning, with the log likelihood ratio module, log likelihood ratio values for bits of the associated data identified as stored in unreliable memory elements of the non-volatile memory based on a record identifying logic values at which the associated bits were programmed into the non-volatile memory. The method may further include storing, with the log likelihood ratio module, the log likelihood ratio values in volatile memory.

In some embodiments, the plurality of write modules may further include a scrambler module configured to scramble the data. The tracking module may be configured to track the logic values of the bits after the data is scrambled by the scrambler module.

In some embodiments, a database may identify unreliable storage locations in the non-volatile memory, and the unreliable storage location identifier module may use information about the unreliable storage locations identified in the database to determine the identified unreliable memory elements.

In some embodiments, the plurality of write modules may further include an encoder module configured to generate parity bits for the data after the tracking module tracks the logic values of the bits of the data to be stored in the identified unreliable memory elements.

In some embodiments, the tracked logic values may include an array of logic values. The plurality of write modules may further include a distribution module that determines whether an accumulated number of the tracked logic values exceeds a size of a first storage area of the non-volatile memory allocated to store the tracked logic values. When the accumulated number exceeds the size of the storage area, the distribution module may remove one or more of the tracked logic values from the array based on a distribution of identified unreliable bitlines across a second storage area of the non-volatile memory designated to store the data.

In some embodiments, the tracked logic values may be stored in a footer portion of a storage area that includes the plurality of memory elements.

In some embodiments, the log likelihood ratio module may set sign bits for the log likelihood ratio values to correspond to the tracked logic values.

In some embodiments, the log likelihood ratio module may set likelihood value components for the log likelihood ratio values to indicate greater than a 75% likelihood.

Other embodiments are possible, and each of the embodiments can be used alone or together in combination. Accordingly, various embodiments will now be described with reference to the attached drawings.

EXEMPLARY EMBODIMENTS

The following embodiments describe non-volatile memory systems and related methods for encoding and decoding data that includes bits stored in memory elements identified as unreliable. Before turning to these and other embodiments, the following paragraphs provide a discussion of exemplary non-volatile memory systems and storage modules that can be used with these embodiments. Of course, these are just examples, and other suitable types of non-volatile memory systems and/or storage modules can be used.

FIG. 1A is a block diagram illustrating a non-volatile memory system 100. The non-volatile memory system 100 may include a controller 102 and non-volatile memory that may be made up of one or more non-volatile memory dies 104. As used herein, the term die refers to the set of non-volatile memory cells, and associated circuitry for managing the physical operation of those non-volatile memory cells, that are formed on a single semiconductor substrate. The controller 102 may interface with a host system and transmit command sequences for read, program, and erase operations to the non-volatile memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable flash interface, such as Toggle Mode 200, 400, or 800. In one embodiment, the memory system 100 may be a card based system, such as a secure digital (SD) or a micro secure digital (micro-SD) card. In an alternate embodiment, the system 100 may be part of an embedded memory system.

Although in the example illustrated in FIG. 1A, the non-volatile memory system 100 may include a single channel between the controller 102 and the non-volatile memory die(s) 104, the subject matter described herein is not limited to having a single memory channel. For example, in some NAND memory system architectures, 2, 4, 8 or more NAND channels may exist between the controller and the NAND memory die(s) 104, depending on controller capabilities. In any of the embodiments described herein, more than a single channel may exist between the controller and the memory die(s)s 104, even if a single channel is shown in the drawings.

Figure 1B:
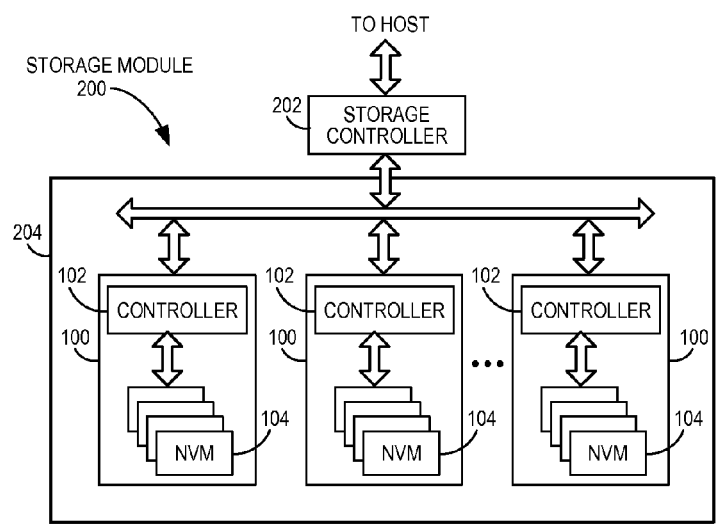
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage system 200, in one embodiment, may be a solid state drive (SSD), such as found in portable computing devices, such as laptop computers and tablet computers, and mobile phones.

Figure 1C:
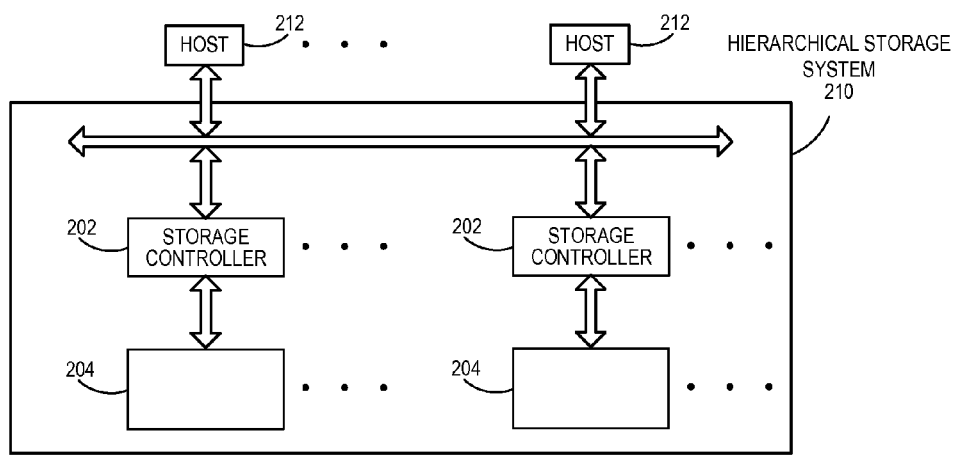
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
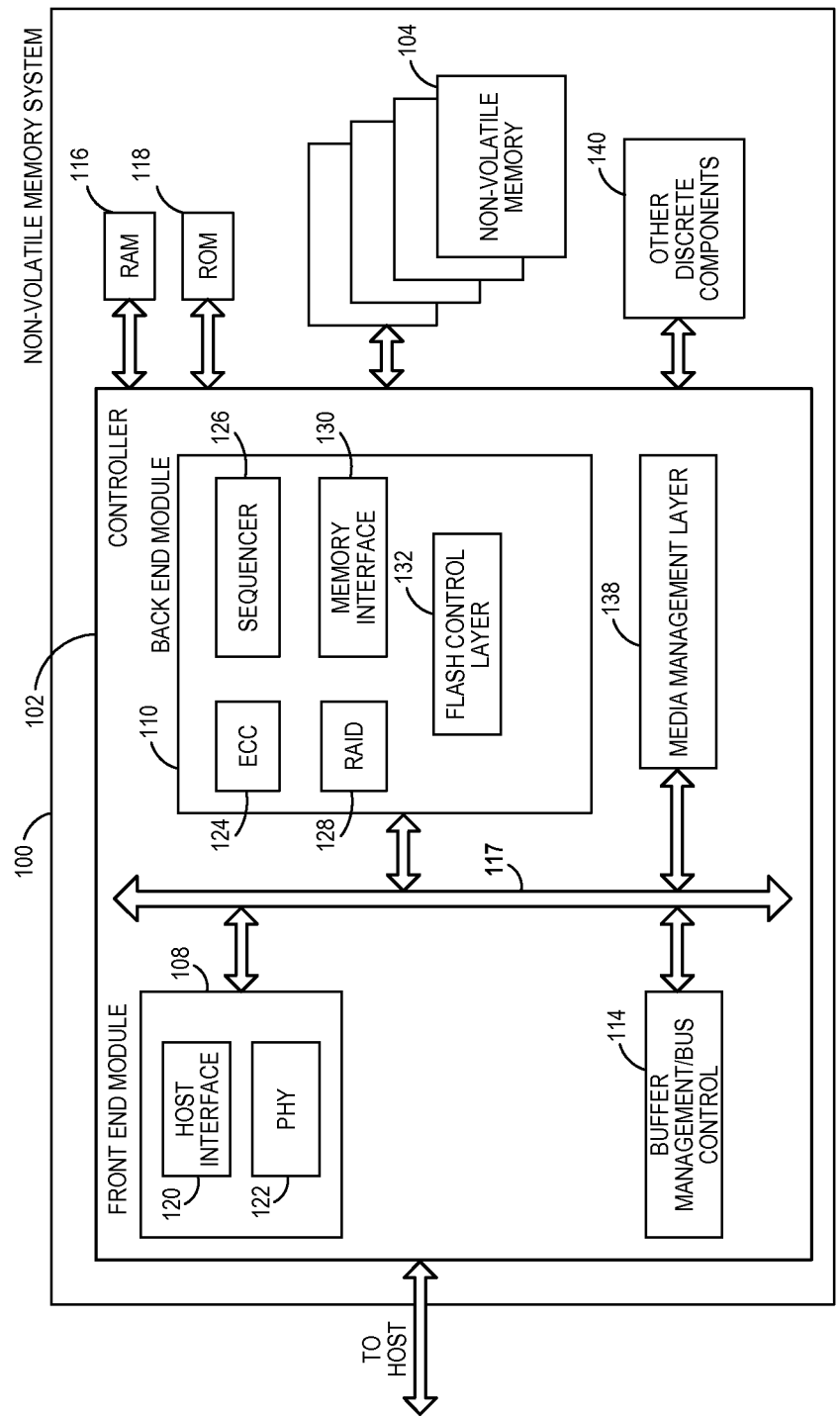
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host, and decodes and error corrects the data bytes read from the non-volatile memory 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface, such as a Toggle Mode 200, 400, or 800 interface. A flash control layer 132 may control the overall operation of back end module 110.

Additional modules of the non-volatile memory system 100 illustrated in FIG. 2A may include a media management layer 138, which performs wear leveling of memory cells of the non-volatile memory die 104. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Figure 2B:
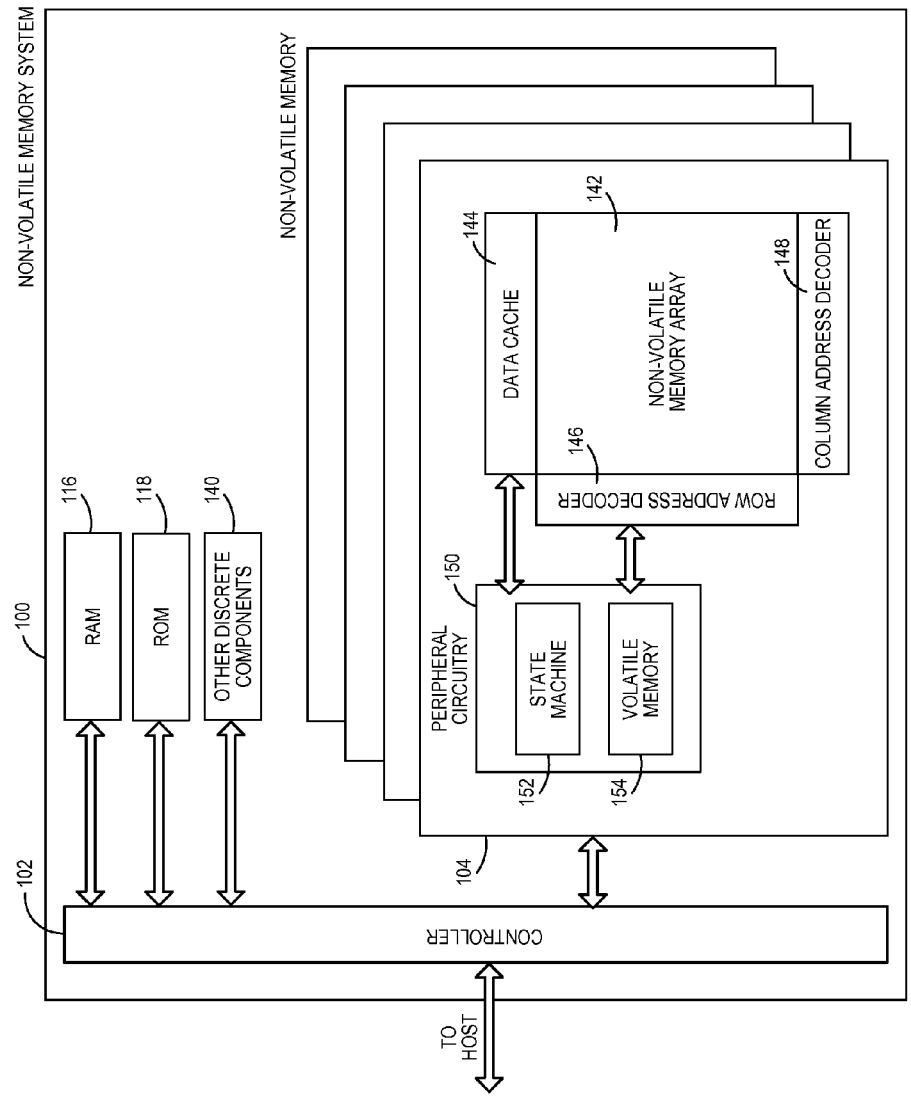
FIG. 2B is a block diagram of exemplary components of a non-volatile memory die of the non-volatile memory system of FIG. 1A.

FIG. 2B is a block diagram illustrating exemplary components of a non-volatile memory die 104 in more detail. The non-volatile memory die 104 may include a non-volatile memory array 142. The non-volatile memory array 142 may include a plurality of non-volatile memory elements or cells, each configured to store one or more bits of data. The non-volatile memory elements or cells may be any suitable non-volatile memory cells, including NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable. In addition, the memory elements or cells may be configured as single-level cells (SLCs) that store a single bit of data per cell, multi-level cells (MLCs) that store multiple bits of data per cell, or combinations thereof. For some example configurations, the multi-level cells (MLCs) may include triple-level cells (TLCs) that store three bits of data per cell.

Additionally, a flash memory cell may include in the array 142 a floating gate transistor (FGT) that has a floating gate and a control gate. The floating gate is surrounded by an insulator or insulating material that helps retain charge in the floating gate. The presence or absence of charges inside the floating gate may cause a shift in a threshold voltage of the FGT, which is used to distinguish logic levels. That is, each FGT's threshold voltage may be indicative of the data stored in the memory cell. Hereafter, FGT, memory element and memory cell may be used interchangeably to refer to the same physical entity.

The memory cells may be disposed in the memory array 142 in accordance with a matrix-like structure of rows and columns of memory cells. At the intersection of a row and a column is a FGT (or memory cell). A column of FGTs may be referred to as a string. FGTs in a string or column may be electrically connected in series. A row of FGTs may be referred to as a page. Control gates of FGTs in a page or row may be electrically connected together.

The memory array 142 may also include wordlines and bitlines connected to the FGTs. Each page of FGTs is coupled to a wordline. In particular, each wordline may be coupled to the control gates of FGTs in a page. In addition, each string of FGTs may be coupled to a bitline. Further, a single string may span across multiple wordlines, and the number of FGTs in a string may be equal to the number of pages in a block.

Figure 3:
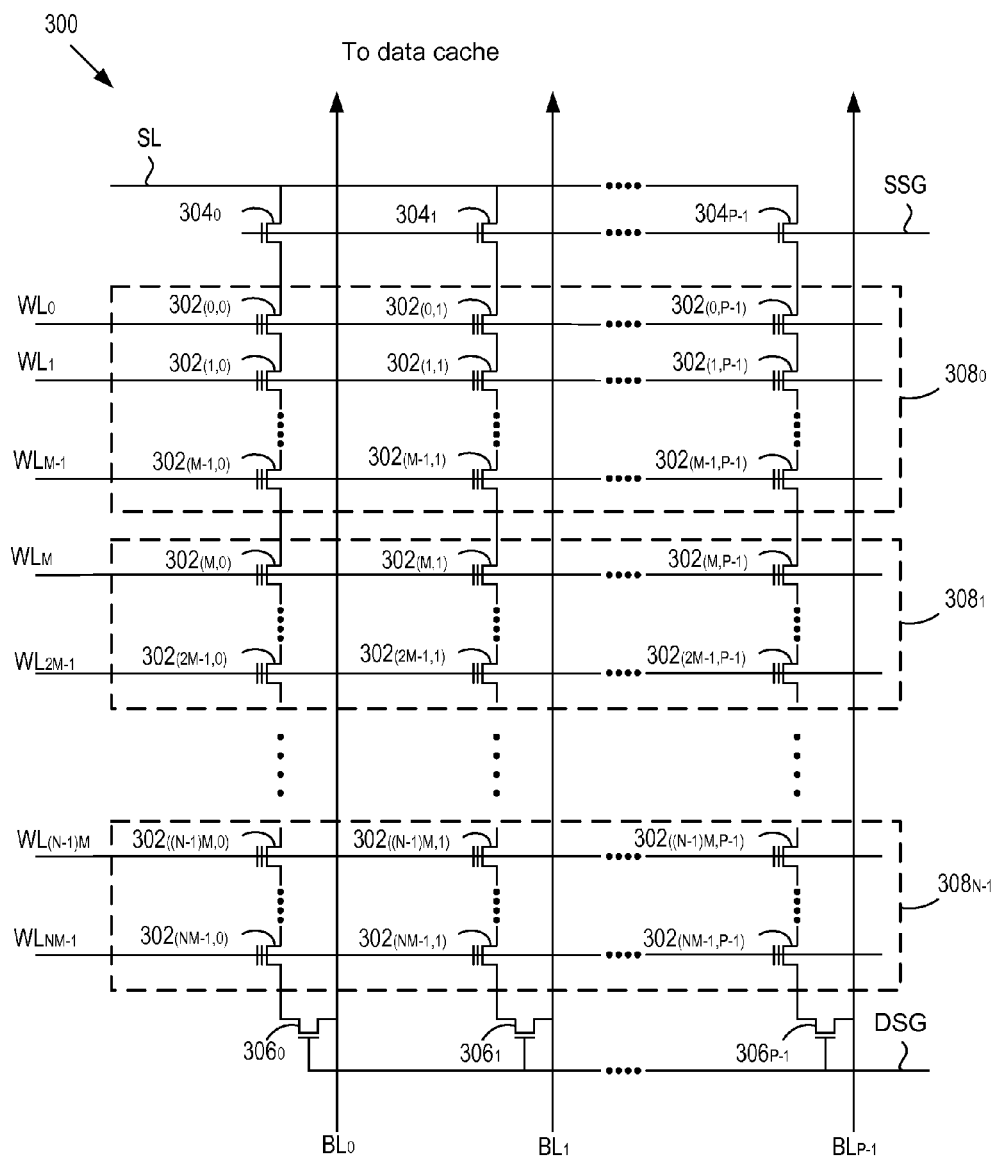
FIG. 3 is a circuit schematic diagram of an exemplary NAND-type flash memory array.

FIG. 3 is a circuit schematic diagram of at least a portion of an exemplary NAND-type flash memory array 300, which may be representative of at least a portion of the memory array 142. The memory array portion 300 may include a P-number of series-connected strings of (N times M) FGTs, each coupled to one of a P-number of bitlines $BL_1$ to $BL_{P-1}$, where N is the number of blocks $308_0$ to $308_{N-1}$ in the memory array 300, and M is the number of pages of FGTs coupled to wordlines WL in each of the N-number of blocks $308_0$ to $308_{N-1}$.

To sense data from the FGTs, a page of FGTs and a corresponding wordline may be selected, and current sensing of bitlines may be employed to determine whether a floating gate of a FGT in the selected page contains charge or not. Current that flows through a string may flow from a source line SL, through the string, to a bitline BL to which the string is coupled. The string may be coupled to the source line SL via a source select transistor, and may be coupled to its associated bitline BL via a drain select transistor. For example, a first string of FGTs $302_{(0,0)}$ to $302_{(NM-1,0)}$ may be coupled to the source line SL via a source select transistor $304_0$ that is connected to the source line SL, and may be coupled to its associated bitline $BL_0$ via a drain select transistor $306_0$. The other strings may be similarly coupled. Switching of source select transistors $304_0$, $304_1$, . . . , $304_{P-1}$ may be controlled using a source select gate bias line SSG that supplies a source select gate bias voltage $V_{SSG}$ to turn on an off the source select transistors $304_0$, $304_1$, . . . , $304_{P-1}$. Additionally, switching of drain select transistors $306_0$, $306_1$, . . . , $306_{P-1}$ may be controlled using a drain select gate bias line DSG that supplies a drain select gate bias voltage $V_{DSG}$ to turn on and off the drain select transistors $306_0$, $306_1$, . . . , $306_{P-1}$.

Referring back to FIG. 2B, the non-volatile memory die 104 may further include a page buffer or data cache 144 that caches data that is sensed from and/or that is to be programmed to the memory array 142. The non-volatile memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the non-volatile memory die 104 may include peripheral circuitry 150. The peripheral circuitry 150 may include a state machine 152 that provides status information to the controller 102. Other functionality of the state machine 152 is described in further detail below. The peripheral circuitry 150 may also include volatile memory 154. An example configuration of the volatile memory 154 may include latches, although other configurations are possible.

Figure 4:
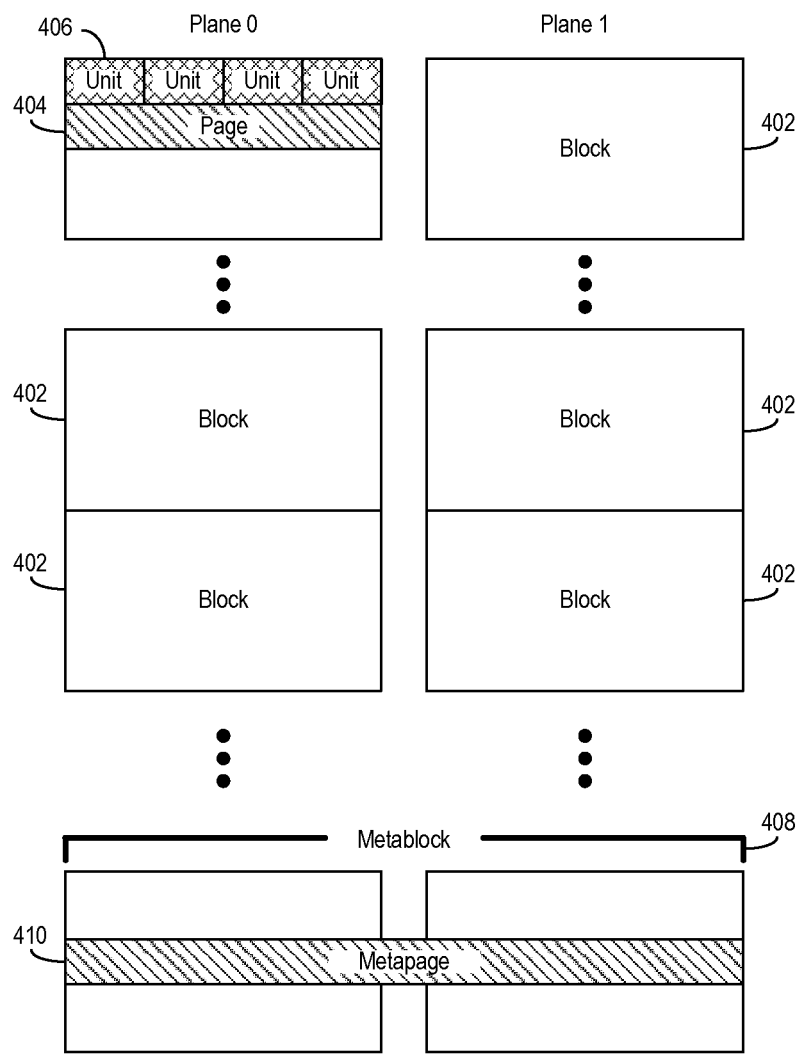
FIG. 4 is a block diagram of an example organizational arrangement or hierarchy of a memory array for flash memory.

Referring to FIG. 4, the memory array 142 and/or a plurality of memory arrays 142 spanning multiple memory dies 104 may have an organizational arrangement or hierarchy under which memory elements or cells of the memory array 142 and/or multiple memory arrays 142 of multiple memory dies 104 may be organized. The controller 102 may be configured to store and access data in accordance with the organizational arrangement or hierarchy.

FIG. 4 is a block diagram of an example organizational arrangement or hierarchy of a memory array 142 for flash memory. As mentioned, for flash memory, the memory cells may be divided or organized into blocks 402, and each block 402 may further be divided into a number of pages 404. Each block 402 may contain the minimum number of memory elements that may be erased together. In addition, each page 404 may be a unit of sensing in the memory array 142. Each individual page 404 may further be divided into segments or units 406, with each segment or unit 406 containing the fewest number of memory cells that may be written to at one time as a basic programming operation. Data stored in a segment or unit of memory cells—referred to as a flash memory unit (FMU), an ECC page, or a codeword—may contain the amount of data that is written at one time during a basic programming operation and/or the amount of data that can be encoded or decoded by the ECC engine 124 during a single encoding or decoding operation. The pages 404 may be divided into the same number of segments or units. Example numbers of segments or unit may be four or eight, although other numbers are possible. In general, data may be stored in blocks and pages of memory elements non-contiguously (randomly) or contiguously.

In addition, the organizational arrangement or hierarchy may include one or more planes in which each of the blocks 402 may be configured. Generally, a plane includes a "column" of blocks 402, although other configurations may be possible. A single memory array 142 may include a single plane or multiple planes. The example arrangement shown in FIG. 4 includes two planes, Plane 0 and Plane 1. Data stored in different planes may be sensed simultaneously or independently.

Additionally, the organizational arrangement or hierarchy may include metablocks 408 and metapages 410. A metablock address or number identifying a metablock may be mapped to and/or correspond to a logical address (e.g., a logical group number) provided by a host. A metablock 408 and a metapage 410 may span or be distributed across a respective single block and page in a single plane, or alternatively, may span or be distributed across respective multiple blocks and multiple pages across multiple planes. FIG. 4 shows the metablock 408 and the metapage 410 spanning across two planes, Plane 0 and Plane 1. Depending on the organizational arrangement, metablocks 408 and metapages 410 spanning across multiple planes may span across only those planes of a single memory die 104, or alternatively may span across multiple planes located of multiple memory dies 104.

Referring back to FIG. 3, the organizational arrangement or hierarchy may also group the bitlines (BL) into groups (otherwise referred to as columns) of bitlines (BL). Grouping the bitlines may reduce the complexity of addressing the storage locations of the array in that a column address over a page may be identified on the basis of groups (or columns) of bitlines, rather than on a bitline-by-bitline basis. In one example, a block 308 may include 16,000 bitlines (i.e., P=16,000), and every sixteen bitlines BL may be grouped together in a group (or column). Grouping the 16,000 bitlines BLs into groups or columns of sixteen may yield only 1,000 column addresses over a page, rather than 16,000 column addresses.

At some point during the lifetime of the non-volatile memory system 100, some of the memory elements of an array may store data unreliably. These memory elements may store data unreliably for various reasons, such as due to open circuits, closed circuits, short circuits, endurance or retention issues (e.g., a memory element has exceeded a certain threshold number of program/erase cycles), or as a result of program disturb (when a bit is programmed into a memory element and then later, a neighboring memory element (from the same wordline or an adjacent wordline) is programmed at a higher state, causing the first memory element to be programmed at a slightly higher state). Whatever the reason, memory elements may be or become unreliable, and as a result may not reliably return data at the values at which the data was programmed.

For purposes of the present description, the term "bad" may be used interchangeably with "unreliable." Accordingly, the term "bad" may be used in conjunction with various storage locations or components of an array (e.g., memory elements, bit lines, bitline groups, or other groupings or zones of memory elements) to indicate those storage locations or components as unreliable and/or that are at least identified in the non-volatile memory system 100 as being unreliable. Similarly, the term "good" may be used to refer to reliable storage locations or components and/or that are identified in the non-volatile memory system 100 as being reliable. In addition, the terms "bad" and "good" may be used in conjunction with data (including bits of data) to indicate that the data is to be stored or is being stored in reliable and unreliable storage locations, respectively.

In some situations, memory elements coupled to the same bitline may be similarly unreliable. That is, if one memory element coupled to a particular bitline is unreliable, the other memory elements that are coupled to that bitline may also be unreliable. Accordingly, the controller 102 may be configured to identify unreliable memory elements on a bitline basis. If the controller 102 identifies a bitline as unreliable, it may presume that all of the memory elements coupled to that bitline are unreliable. In addition, if the controller 102 identifies a particular memory element as unreliable, it may presume that the other memory elements coupled to the same bitline are also unreliable and identify that bitline as an unreliable bitline.

Figure 5:
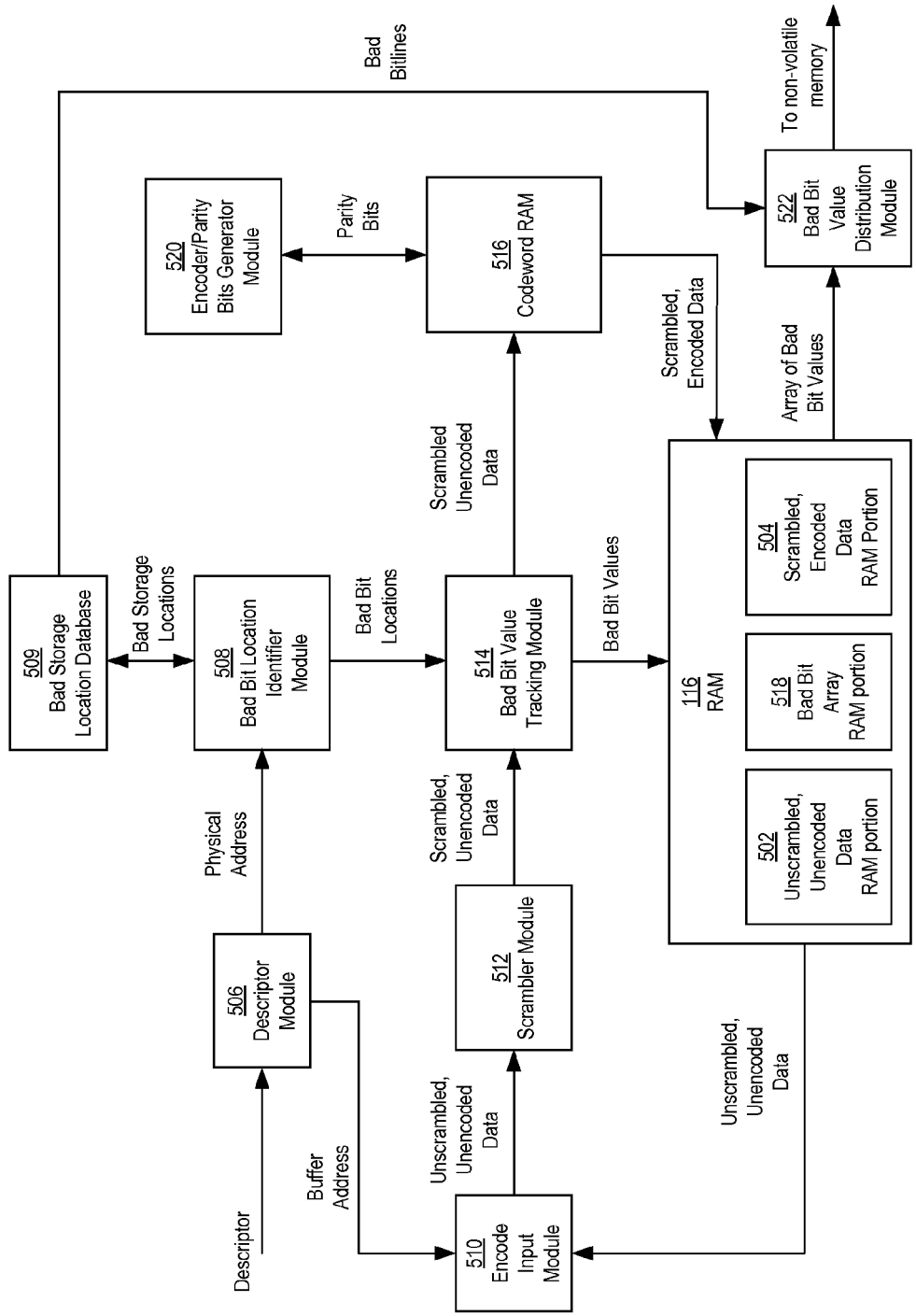
FIG. 5 is a block diagram of exemplary modules of the controller of FIG. 2A used to perform an encoding process.

Referring to FIG. 5, the controller 102 may be configured to maintain a bad bitline (BL) database 500 to identify bad bitlines. Each entry 502 in the bad bitline database 500 may include two fields, a bad bitline group field 504, and an associated bad bitline bitmask field 506. The bad bitline group field 504 may identify a bad bitline group. The bad bitline bitmask field 506 may be a bitmask identifying which of the bitlines in that bitline group are bad. The fields 504, 506 are shown as including four-digit hexadecimal values. The four-digit hexadecimal bitmask value in the bad bitmask field 506 may correspond to a sixteen-digit binary value, where each digit is associated with one of the bitlines of the associated bitline group. The binary values "1" and "0" in the sixteen-digit binary value may indicate whether that bitline is identified as bad/unreliable or good/reliable. So, as an example, the bad bitline group field 504 of a first entry 502a includes the hexadecimal value "0x0008" which indicates that the eighth bitline group includes at least one bad bitline. In the associated bad bitline bitmask field 506, the four-digit hexadecimal value "0x1800" corresponds or is equivalent to the sixteen-digit binary value "0001 1000 0000 0000." Moving from right to left across the sixteen-digit binary value, and in the case that the binary value "0" indicates that the associated bitline is good/reliable and the binary value "1" indicates that the associated bitline is bad/unreliable, the sixteen-digit binary value "0001 1000 0000 0000" indicates that the twelfth and thirteenth bitlines are bad and the others are good. Accordingly, in the first entry 502a, the bad bitline group field 504 containing a value of "0x0008" and the bad bitline bitmask field 506 containing a value of "0x1800" may indicate to the controller 102 that twelfth and thirteenth bitlines of the eighth bitline group are bad bitlines. Similarly, the second entry 502b may indicate to the controller 102 that the ninth and tenth bitlines of the twentieth bitline group (0x0014) of the array are bad, and the third entry 502c may indicate to the controller 102 that the first and thirteenth bitlines of the thirty-fourth (0x0022) bit line group of the array are bad.

The controller 102 may be configured to manage (e.g., add, delete, or update) entries 502 in the bad bitline database 500 as it determines or identifies bad/unreliable and good/reliable statuses of the bitlines of the array. In addition, for non-volatile memory systems 100 that include a plurality of memory dies 104, with each memory die 104 including a memory array 142, the controller 102 may be configured to manage a plurality of bad bitline databases 500 for each of the arrays 142. Also, the bad bitline database(s) 500 may be stored in any or a plurality of storage locations within the non-volatile memory system 100 and/or external to the non-volatile memory system 100. For example, a bad bitline database 500 may be stored in the array having the bitlines that the database 500 identifies. So, for multi-die systems 100, each die 104 may store an associated bad bitline database 500. Alternatively, one of the dies 104 may store all of the databases 500 for all of the dies 104. Various other configurations for storing the bad bitline database(s) 500 for multi-die systems 100 may be possible. Additionally, for some example configurations, the controller 102 may be configured to load a copy of the databases(s) 500 into RAM 116 to manage the database(s) 500, such as during initialization and/or when reading and/or writing data to a particular die(s) 104, and may update the versions of the database(s) 500 stored in the non-volatile memory dies 104 as appropriate.

The non-volatile memory system 100 may use information about bad storage locations to track values of the bad bits to be stored in bad memory elements and use the tracked values to improve decoding performed by the ECC engine 124.

In further detail, FIG. 5 shows a block diagram of components of the controller 102 that may be involved in an encoding process of a write operation to write data into a non-volatile memory die 104. For some example configurations, the components other than the RAM 116 may be components of the ECC engine 124, although in other example configurations, some or all of these components may be considered components separate from the ECC engine 124.

Prior to the encoding process, the data to be written into the non-volatile memory 104, such as that received from a host, may be loaded in the RAM 116 in an unscrambled and unencoded (i.e., raw) format. As used herein, the term "scrambler" may generally refer to manipulating or flipping one or more bit values of a set of data bits so that the data set has an equal or substantially equal distribution of logic 1 and 0 bit values. For purposes of the present description, the terms "scramble," "randomize," and "randomly scramble" may be synonymous and generally refer to manipulating or flipping one or more bit values of a set of data bits so that the data set has an equal or substantially equal distribution of logic 1 and 0 bit values. Also, the term "random" may include "pseudorandom" in that the scrambling may be performed using some form of encryption or scrambling key, such that the encrypted and/or scrambled data may be decrypted and/or descrambled to obtain the original, unscrambled data. Scrambling may be performed on the data before it is stored in the non-volatile memory dies 104 in order to reduce and/or minimize patterns of logic 1 and 0 bit values in the data, which in turn may improve the endurance of the non-volatile memory.

Accordingly, for purposes of the present description, "scrambled" data may be data that has been scrambled in the non-volatile memory system 100 prior to being written into the non-volatile memory 104, whereas "unscrambled" data may be data that has not (yet) been scrambled in the non-volatile memory system 100 prior to being written into the non-volatile memory 104.

In addition, as described in further detail below, the encoding process may include generating parity bits for header and payload portions of the scrambled data. In particular, after the data is scrambled, an encoder module may generate parity bits for the data. Accordingly, as used herein, "encoded" data may be data that includes parity bits and/or data for which parity bits have been generated by the encoder module, and "unencoded" data may be data that does not include parity bits and/or data for which parity bits have not (yet) been generated by the encoder module.

FIG. 5 shows the unscrambled, unencoded data being stored in an unscrambled, unencoded data portion 502 of the RAM 116. After the encoding process, the data may in a scrambled and encoded format, and this version of the data may be loaded in the RAM 116 prior to being transferred to the non-volatile memory die 104 for storage. FIG. 5 shows the scrambled, encoded data being stored in a scrambled, encoded portion 504 of the RAM 116.

To initiate the encoding process, a descriptor module 506 may be configured to receive a descriptor. The descriptor may identify that it is a descriptor for a write operation. In addition, the descriptor may identify the buffer address where the unscrambled, unencoded data is being stored in the RAM 116. The descriptor may also identify the physical address in the non-volatile memory die 104 where the data is to be stored.

Upon receipt of the descriptor, the descriptor module 506 may provide the physical address where the data is to be stored in the memory die 104 to a bad bit location identifier module 508. The bad bit location identifier module 508 may be configured to determine which bits of the data, if any, are to be stored in bad memory elements. To do so, in addition to receiving the physical addresses, the bad bit location identifier module 508 may be configured to access a bad storage location database 509 maintained by the controller 102 to obtain information about bad storage locations. The bad bit location identifier module 508 may then be configured to compare the physical address information with the bad storage location information to determine which bits of the data are to be stored in bad memory elements.

The bad storage location database 509 may identify bad storage locations in various ways and/or in various degrees of granularity. In one example, the bad storage location database 509 may identify bad memory elements individually. In addition or alternatively, the bad storage location database 509 may identify bad storage locations "vertically" in that bad storage locations may be identified on a bitline basis. For example, the bad storage location database 509 may identify "bad bitlines," where each memory element coupled to the bad bitline is considered to be a bad memory element. In still another example, the bad storage location database 509 may identification "bad bitline groups," where a bitline group includes a plurality of bitlines. A bitline group may be identified as bad if it includes at least one bad bitline.

Figure 6:
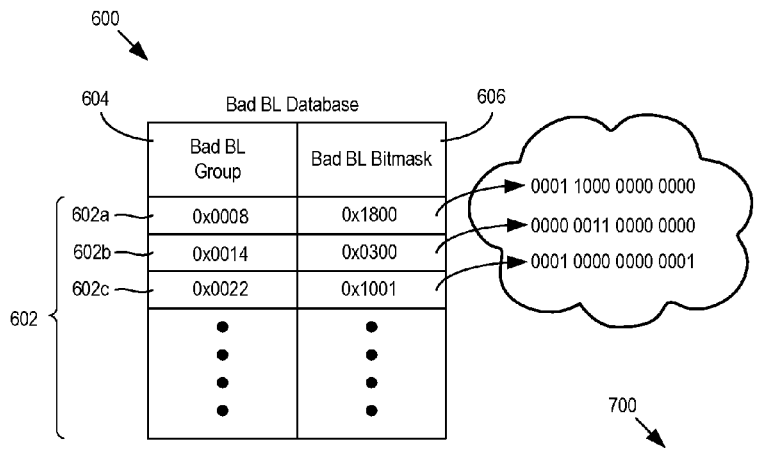
FIG. 6 is a schematic diagram of an example bad bitline database.

FIG. 6 shows a schematic diagram of an example a bad bitline (BL) database 600, which may representative of at least a portion of the bad storage location database 509 of FIG. 5. In the example shown in FIG. 6, the bad BL database 600 may include a plurality of entries 602. Each entry 602 may include two fields, a bad bitline group field 604, and an associated bad bitline bitmask field 606. The bad bitline group field 604 may identify a bad bitline group. The bad bitline bitmask field 606 may be a bitmask identifying which of the bitlines in that bitline group are bad. The fields 604, 606 are shown as including four-digit hexadecimal values, although other formats are possible. The four-digit hexadecimal bitmask value in the bad bitmask field 606 may correspond to a sixteen-digit binary value, where each digit is associated with one of the bitlines of the associated bitline group. The binary values "1" and "0" in the sixteen-digit binary value may indicate whether that bitline is identified as bad/unreliable or good/reliable. So, as an example, the bad bitline group field 604 of a first entry 602a includes the hexadecimal value "0x0008" which indicates that the eighth bitline group includes at least one bad bitline. In the associated bad bitline bitmask field 606, the four-digit hexadecimal value "0x1800" corresponds or is equivalent to the sixteen-digit binary value "0001 1000 0000 0000." Moving from right to left across the sixteen-digit binary value, and in the case that the binary value "0" indicates that the associated bitline is good/reliable and the binary value "1" indicates that the associated bitline is bad/unreliable, the sixteen-digit binary value "0001 1000 0000 0000" indicates that the twelfth and thirteenth bitlines are bad and the others are good. Accordingly, in the first entry 602a, the bad bitline group field 604 containing a value of "0x0008" and the bad bitline bitmask field 606 containing a value of "0x1800" may indicate to the controller 102 that twelfth and thirteenth bitlines of the eighth bitline group are bad bitlines. Similarly, the second entry 602b may indicate to the controller 102 that the ninth and tenth bitlines of the twentieth bitline group (0x0014) of the array are bad, and the third entry 602c may indicate to the controller 102 that the first and thirteenth bitlines of the thirty-fourth (0x0022) bit line group of the array are bad.

In addition or alternatively to identifying bad memory elements individually and/or vertically as bad bitlines, bad storage locations may be identified "horizontally" in terms of "zones" of bad memory elements coupled to the same wordline. Each zone may have an associated wordline to which the memory elements in that zone are coupled, a starting memory element, and a length (number of memory elements).

Figure 7:
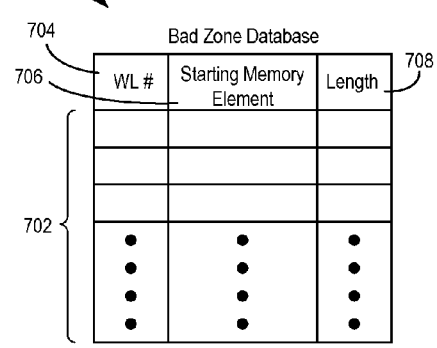
FIG. 7 is a schematic diagram of an example bad zone database.

FIG. 7 shows a schematic diagram of an example bad zone database 700, which may be representative of at least a portion of the bad storage location database 509. The bad zone database 700 may include one or more entries 702, where each entry identifies a bad zone of memory elements. Each entry may include a wordline field 704 that identifies the wordline in which that zone is located, a starting element field 706 for that zone, and a length field 708 that identifies a length (number of memory elements). When querying the bad zone database 700, the bad bit location identifier 508 the starting memory element identified in the starting memory element field 706 as a bad memory element. Additionally, by knowing the length of the zone, the bad bit location identifier 508 may also identify a certain number of other neighboring memory elements coupled to the same wordline as bad memory elements as well. The starting memory element may be addressed on a bit or a byte level of granularity.

In addition or alternatively, bad memory elements or zones of bad memory elements may be identified based on a proximity or number of memory elements away from the row address decoder 146 (FIG. 2B). In further detail, the row address decoder 146 may be configured to select wordlines and drive those wordlines by applying a voltage on them to read data. Drive strength may decrease as memory elements extend further away from the row address decoder 146. For some example configurations, a threshold bitline may be determined, and memory elements coupled to bitlines further away from the row address decoder 146 than the threshold bitline may be identified in the bad storage location database 509 as bad memory elements. For other example configurations, identification of bad memory elements based on their proximity from the row address decoder 146 may be on a wordline-by-wordline basis. For these other configurations, the bad storage location database 509 may identify a threshold memory element for each wordline. Each memory element coupled to that wordline that is further away from the row address decoder 146 than the respective threshold memory element may be identified as a bad memory element.

Other ways of storing and/or identifying bad storage locations in the bad storage location database 509 may be possible. In addition, the controller 102 may be configured to update (e.g., add, delete, update) the bad storage location information in the bad storage location database as the good/bad status of memory elements changes.

In addition, for non-volatile memory systems 100 that include a plurality of memory dies 104, with each memory die 104 including a memory array 142, the controller 102 may be configured to manage the bad storage locations using a single bad storage location database 509 or a plurality of bad storage location databases 509, with at least one database 509 associated with each of the dies 104. In addition or alternatively, bad storage location databases 509 may be maintained on a block-by-block basis. Accordingly, when the controller 102 determines to write data into a particular block, the controller 102 may access the bad storage location database 509 associated with that block.

Also, the bad storage location database(s) 509 may be stored in any or a plurality of storage locations within the non-volatile memory system 100 and/or external to the non-volatile memory system 100. For example, a bad storage location database 500 may be stored in the array or in a particular block of an array that has the bad storage locations that the database 509 identifies. So, for multi-die systems, each array may store at least one associated database 509. Alternatively, one of the dies 104 may store one or more databases 509 for all of the dies 104.

Figure 8:
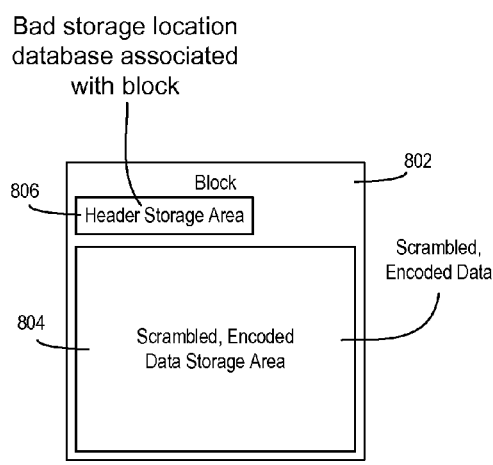
FIG. 8 is a block diagram of an example block storing a bad storage location database in a header storage area.

In addition or alternatively, for configurations where bad storage location databases are generated on a block-by-block basis, a bad storage location database 509 for a particular block may be stored in the block itself. When the controller 102 determines to write to that block, the controller 102 may access the bad storage location database 509 to identify the bad memory elements in that block. FIG. 8 shows a block diagram of an example block 802 that has a first storage area 804 designated for storage of scrambled, encoded data, and a second storage area 806 designated for storage of the bad storage location database for that block 802. In a particular implementation, the second storage area 806 may be a header or initial storage area of the block 802.

Various other configurations for storing the bad storage location database(s) 509 for multi-die systems 100 may be possible. Additionally, for some example configurations, the controller 102 may be configured to load a copy of the databases(s) 509 into the RAM 116 to manage the database(s) 509, such as during initialization and/or when reading and/or writing data to a particular die 104, and may update the versions of the database(s) 509 stored in the non-volatile memory dies 104 as appropriate.

Referring back to FIG. 5, the descriptor module 506 may be configured to send the buffer address information from the descriptor to an encode input module 510. The encode input module 510 may be configured to access the unscrambled, unencoded data from the RAM 116 using the buffer address information, and send the unscrambled, unencoded data to a scrambler module 512.

As mentioned, the scrambler module 512 may be configured to scramble or randomize the data so that the data has a generally equal distribution of logic "1" and "0" bit values. The scrambler module 512 may include a single scrambler or a plurality of scramblers. One type of scrambler may use one or more scrambler keys generated from a seed, which in some cases may be a randomly selected value. Another type of scrambler may be an encryption engine, such as an Advanced Encryption Standard (AES) engine, that generates and outputs an encrypted version of the data. Due to the nature of the encryption, the encrypted data may be randomly formatted. Some configurations of the scrambler module 512 may include an encryption engine and a second-stage scrambler that uses one or more scrambling keys generated from a randomly generated seed, such as through the use of a linear feedback shift register (LFSR) engine. Various ways of implementing the two scramblers may be possible. For example, all of the data may pass through both the encryption engine and the second-stage scrambler. Alternatively, only some of the data (such as a payload portion of the data) may pass through the encryption engine, while other portions of the data (such as a header portion of the data) may be not be encrypted by the encryption engine but may pass through the second-stage scrambler. Other example configuration may include and/or utilize only the encryption engine or only the second-stage scrambler. Various scrambling configurations for the scrambler module 512 are possible.

After the data is scrambled, the scrambled, unencoded version of the data may be sent to a bad bit value tracking module 514 that may be configured to track and/or generate a record the bit values (logic 1s and 0s) of the bad bits. In particular, the bad bit value tracking module 514 may receive information about the bad bit locations (i.e., bad memory elements) where the data is to be stored from the bad bit location identifier module 508 and identify and/or track the bit values of the bad bits of the scrambled, encoded data that are to be stored in the bad memory elements. For some example configurations, the bad bit value tracking module 514 may let the good bits pass through without recording their logic values. The scrambled, encoded data may then be passed through to a codeword RAM 516 (volatile memory). In addition, the bad bit value tracking module 514 may be configured to send the bit values of the bad bits to the RAM 116. The bit values of the bad bits may be in the form of a "string" of bad bit values and stored as an array, such as a linear array, in the RAM 116. FIG. 5 shows the bit values of the bad bits stored in a bad bit array portion 518 of the RAM 116.

An encoder module 520 may access the scrambled, unencoded data in the codeword RAM 516 to encode the scrambled, unencoded data. In particular, the encoder 520 may analyze the data to generate a set of parity bits associated with the data. In general, the scrambled, unencoded data may include a payload portion and a header portion. The payload portion may include the actual data desired to be stored in the non-volatile memory die 104, which may include the data that is provided from a host. The header may include various information about the payload data, such as logical address information, the write source, when the data is written (timestamp), flag fields, reversion numbers, and scrambler seeds as non-limiting examples. The parity bits may be generated during encoding in order to detect and correct errors of the header and payload portions of the data during a decoding phase of a read operation to read the data from the non-volatile memory die 104, as explained in further detail below. After the encoder module 520 generates the parity bits, the parity bits may be added to the header and payload portions to form the scrambled, encoded version of the data, which may then be sent from the codeword RAM 516 to the scrambled, encoded data portion 604 of the RAM 116. After the scrambled, encoded data is loaded into the RAM 116, the controller 102 may transfer the data, with the memory interface 130, to the non-volatile memory die 104.

As previously described with reference to FIG. 4, pages of data may be divided into ECC pages, each of which may include the amount of data that can be encoded or decoded by the ECC engine 124 during a single encoding or decoding operation. Accordingly, unscrambled, unencoded data may be accessed by the encode input module 510 and sent through the scrambler module 512, the bad bit value tracking module 514, and into the codeword RAM 516 for generation of parity bits one ECC page of data per round of encoding. However, multiple ECC pages of data may be stored in a block. Accordingly, as multiple ECC pages of data are passed through the bad bit value tracking module 514, the bit values of bad bits being sent to the bad bit array portion 518 of the RAM 116 may accumulate such that the array of bit values stored in the bad bit array portion 518 may be for the bad bits of multiple ECC pages to be stored in the same block.

For some example configurations, a predetermined amount of storage in a block of the non-volatile memory 104 may be allocated for storage of the array of bad bit values for that block. In a particular configuration, the predetermined amount of storage may be an ECC page of storage, although other amounts may be possible. In some configurations that identify bad memory elements on a bitline basis, depending on the number of bad bitlines identified in the bad bitline database 600, the size of the array of bad bit values may be greater than the predetermined amount allocated in the block for its storage. As shown in FIG. 5, a bad bit value distribution module 522 may be configured to determine if the size of the array of bad bit values is greater than the allocated amount of storage. If so, the bad bit tracking distribution module 522 may be configured to select bad bit values to remove from the array so that the size of the array does not exceed the allocated amount. The bad bit tracking distribution module 622 may do so in a way that aims to evenly distribute the bad bits identified in the array horizontally across the block. In this way, the array may not disproportionately identify bad bit values for bad bits to be stored earlier in the write process compared to later in the write process. As previously mentioned and described in more detail below, tracking the bad bit values may facilitate decoding, and so evenly distributing the bad bit values horizontally across a block may evenly facilitate decoding across the block when the data is read.

In one example configuration, the bad bit tracking distribution module 522 may be configured to generate a histogram of the bad bitlines based on the bad bitline information received from the bad bitline database 600. To even the distribution of bad bits, the bad bit tracking distribution module 522 may reduce the frequency of one or more bins with higher frequency values until the size of the array falls to within the allocated amount of storage.

Figure 9:
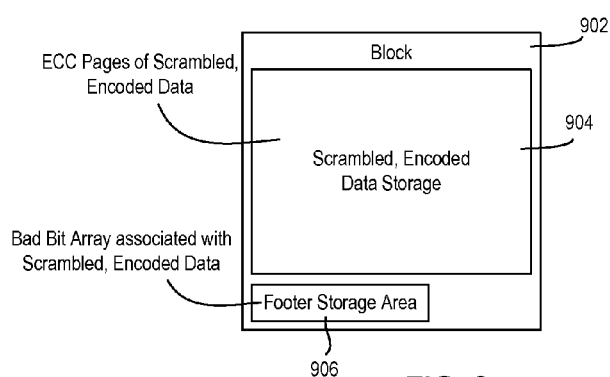
FIG. 9 is a block diagram of an example block storing a bad bit array in a footer storage area.

The array of bad bit values may be stored in a non-volatile manner anywhere in the memory dies 104. For some example configurations, the array of bad bit values may be stored in the block along with the ECC pages having the bad bits that the array identifies. FIG. 9 shows a block diagram of an example block 902 including a first storage area 904 for storing the ECC pages of scrambled, encoded data and a second storage area for storing the bad bit values associated with the ECC pages. In a particular configuration, as shown in FIG. 9, the second storage area may be a footer storage area—i.e, the last available storage area of the block 902. So, if for example, an ECC page of storage is allocated for the array of bad bit values, then the footer storage area 904 may be the last ECC page of storage in the block available to store data. For some example configurations, the array of bad bit values may not be stored in the footer storage area 904 until the rest of the block 902 is full or identified as closed.

Additionally, the example storage configurations shown in FIGS. 8 and 9 may be combined. Accordingly, a block of storage in the non-volatile memory 104 may include a storage area, such as a header storage area, designated for the bad storage location database for that block, and a footer storage area designated for storing logic values of the bad bits of the data stored in that block.

In addition, for purposes of redundancy, a copy of the array of bad bit values may be stored in the non-volatile memory dies 104 elsewhere other than in the block 902, such as in a different block of the same die or in a different die.

FIG. 10 shows a block diagram of components of the controller 102 that may be involved in a decoding process of a read operation to read scrambled, encoded data from a non-volatile memory die 104. When the scrambled, encoded data is to be read from the non-volatile memory die 104, such as in response to a host read request, the controller 102 may communicate with the memory die 104, such as through the memory interface 130, to retrieve the data and load the data into the RAM 116. FIG. 10 shows the scrambled, encoded data being stored in a scrambled, encoded data portion 1002 of the RAM 116.

The scrambled, encoded data may be loaded into the RAM 116 in a one-bit, two-bit, or three-bit format. In the one-bit format, the scrambled, encoded data read from the non-volatile memory 104 may include single-bit representations of each of the bits of the scrambled, encoded data that was written into the non-volatile memory die 104. These single-bit representations, referred to as hard bits, may each have a logic 1 or logic 0 value and are indicative of the values of the bits as read from the non-volatile memory die 104. In the two-bit format, the scrambled, encoded data read from the non-volatile memory 104 may include two-bit representations of each of the scrambled, encoded data that was written into the non-volatile memory die 104. The two-bit representations may each include the hard bit and one soft bit, which may also have a logic 1 or logic 0 value. The soft bit added to the hard bit provides a probability or a confidence level that the value of the hard bit is correct, i.e., it matches the value of the bit when written into the memory die 104. In combination, the hard bit and soft bit provide four different binary values. In the three-bit format, the scrambled, encoded data read from the non-volatile memory 104 may include three-bit representations of each of the bits of the scrambled, encoded data that was written into the non-volatile memory die 104. The three-bit representations may each include the hard bit and two soft bits, each of which may have a logic 1 or logic 0 value. Like the single soft bit, the two soft bits added to the hard bit provides a probability or confidence level that the value of the hard bit is correct. In combination, the hard bit and two soft bits provide eight different binary values.

To initiate the decoding process, a descriptor module 1006 may be configured to receive a descriptor. The descriptor may identify that it is a descriptor for a read operation. In addition, the descriptor may identify the buffer address where the scrambled, encoded data is being stored in the RAM 116. The descriptor may also identify the physical address in the non-volatile memory die 104 where the scrambled, encoded data is stored.

As with the encoding process, upon receipt of the descriptor, the descriptor module 1006 may provide the physical address information to a bad bit location identifier module 1008, which may be configured to determine which bits of the data, if any, are stored in bad memory elements. To do so, the bad bit location identifier module 1008 may be configured to compare the physical address information received from the descriptor module 1006 with bad storage location information it accesses from the bad storage location database 509. Based on the comparison, the bad bit location identifier module 1008 may determine which memory elements, if any, are bad.

The descriptor module 1006 may also be configured to send the buffer address information to a decode input module 1010. The decode input module 810 may be configured to retrieve the scrambled, encoded data from the RAM 116 using the buffer address information, and send the scrambled, encoded data to a log likelihood ratio (LLR) module 1012.

The LLR module 1012 may be configured to assign an associated LLR value for each of the bits of the scrambled, encoded data. An LLR value may indicate whether the bit with which it is associated has a logic 1 or logic 0 value, and a likelihood or confidence level of that value being correct—i.e., that the logic value of the bit as it was read from the die 104 matches the logic value of the bit as it was written into the die 104. FIG. 11 shows a schematic diagram of an example LLR value 1100. The LLR value 1100 may include a sign bit 1102, which may indicate whether the associated bit is read from the memory die 104 as a logic 1 or logic 0 value. The value of the sign bit 1102 may correspond to the logic value of the hard bit. The LLR value 1100 may also include an M-bit likelihood value component 1104, which may indicate a likelihood or confidence level of the sign bit 1102 representing the correct value of the associated bit. The sign bit 1102 and the M-bit likelihood value component 1104, together, may be a combined (M+1)-bit value representing a number in a range from a lower bound of $-2^M$ to an upper bound of $+2^M$. One of the bounds, such as the lower bound, may be correspond to the logic 0 value, and the other bound, such as the upper bound, may correspond to the logic 1 value. The closer the (M+1)-bit number is to a bound, the higher the likelihood or confidence level that the logic level corresponding to that bound is the correct logic value for the associated bit. The (M+1)-bit number being equal to a bound may indicate that there is a 100% likelihood or confidence level that the logic value corresponding to that bound is the correct logic level for the associated bit.

In one example, M is 6, and so the combined sign bit 1102 and the 6-bit likelihood value component 1104 may represent a number in the range from −64 to +64. The closer the combined 7-bit number is to −64, the greater the likelihood or confidence level that the hard bit read at the logic 0 value is the correct value for that bit. Similarly, the closer the combined 7-bit number is to +64, the greater the likelihood or confidence level that the hard bit read at the logic 1 value is the correct value for that bit.

In addition to the sign bit 1102 and the M-bit likelihood value component 1104, the LLR value 1100 may include a locking bit 1106. As described in further detail below, in the event that the ECC engine 124 detects errors in the scrambled, encoded data, a decoder module 1020 (FIG. 10) may determine to adjust one or more LLR values by flipping the sign bit 1102 and/or adjusting the M-bit likelihood value component 1104. In the event that the decoder module 1020 determines to adjust one or more LLR values, the decoder module 1020 may be configured to refrain from adjusting LLR values that are locked, as indicated by the values of their respective locking bits. Conversely, in the event that the decoder module 1020 determines that LLR values need to be adjusted, the decoder module 1020 may be configured to identify LLR values as being available for adjustment if they are not locked, as indicated by the values of their respective locking bits.

As mentioned, when the decoding process is initiated, the decode input module 1010 may retrieve the scrambled, encoded data stored in the RAM 116 and send the data to the LLR module 1012. The data may be sent to the LLR module 1012 as either one-bit, two-bit, or three-bit representations of the associated data stored in the memory die 104, as described. In addition to receiving the n-bit (1-bit, 2-bit, or 3-bit) representations, the LLR module 1012 may also be configured to receive bad bit location information from the bad bit location identifier module 1008. Using the bad bit location information, the LLR module 1012 may be configured to determine, for each n-bit representation, whether or not each of the associated bits stored in the die 104 is stored in a bad memory element. The LLR module 1012 may then be configured to assign a LLR value for the associated bit based on the determination.

In further detail, if the LLR module 1012 determines that the associated bit is not stored in a bad memory element, then the LLR module 1012 may be configured to assign a LLR value for that bit by accessing a good bit LLR table 1014 that contains LLR value information. In particular, the good bit LLR table 1014 may include associations between the possible n-bit representation values and LLR value information. The LLR value information may include either a complete LLR value or at least portion of a LLR value. For example, each n-bit representation value identified in the LLR table 1014 may be associated with at least the M-bit likelihood value component 1104 of a LLR value, and optionally include the sign bit 1102 and/or the locking bit 1106. For implementations where the sign bit 1102 and/or the locking bit 1106 are not included in the good bit LLR table 1014, the LLR module 1012 may be configured to add those bits to the M-bit likelihood value component 1104 before sending the complete LLR value to a codeword RAM 1016 (volatile memory). Additionally, the number of entries in the good bit LLR table 1014 may correspond to the number of bits in the n-bit representations, particularly $2^n$. Accordingly, if the scrambled, encoded data loaded into the RAM 116 includes one-bit representations, then the good bit LLR table 1014 may include two entries, one entry associating logic value 0 to first LLR value information, and another entry associating logic value 1 to second LLR value information. Similarly, if the scrambled, encoded data loaded into the RAM 116 includes two-bit representations (one hard bit and one soft bit), then the good bit LLR table 1014 may include four entries, and if the scrambled, encoded data loaded into the RAM 116 includes three-bit representations (one hard bit and two soft bits), then the good bit LLR table 1014 may include eight entries.

Upon receiving an n-bit representation and identifying that the bit with which it is associated is not stored in a bad memory element, the LLR module 1012 may query the good bit LLR table 1014 to obtain associated LLR value information. In particular, the LLR module 1012 may locate an entry in the good bit LLR table 1014 having an n-bit representation value that matches the value of the n-bit representation the LLR module 1012 received, and retrieve the LLR value information associated with the matching n-bit representation value. If the LLR value information does not include a complete LLR value, then the LLR module 1012 may add a sign bit and/or a locking bit to the LLR value information obtained from the good bit LLR table 1014. Since the associated bit is identified as not being stored in a bad memory element, then the locking bit, either as it is included with the other LLR value information in the good bit LLR table 1014 or as it is added to the M-bit likelihood value component by the LLR module 1012, may be set to a value indicating that the LLR value is unlocked. The LLR module 1012 may then send the LLR value to the codeword RAM 1016 for temporary storage before the decoding process.

Alternatively, if the LLR module 1012 determines that the associated bit is stored in a bad memory element, then the LLR module 1012 may be configured to assign a LLR value for the associated bit without accessing the good bit LLR table 1014. In further detail, the array of bad bit values may be retrieved from the non-volatile memory dies 104 and loaded into a bad bit array portion 822 of the RAM 116. The LLR module 1012 may be configured to analyze the array to determine the logic value of the associated bit when it was originally written into the memory die 104 (i.e., the correct logic value). Then, since the LLR module 1012 knows the correct value, it may be configured to assign a LLR value for the associated bit such that (1) the logic value of the sign bit matches the logic value identified in the array, and (2) the M-bit likelihood value component indicates a relatively high likelihood or confidence level that the sign bit indicates the correct value. In some example implementations, the M-bit likelihood value component may indicate a 100% likelihood or confidence level. For other example implementations, the M-bit likelihood value component may indicate a likelihood or confidence level that is less than 100%, such as 75% or greater. In addition, the LLR value assigned to an associated bit stored in a bad memory element may also include a locking bit at a value that indicates that the LLR value is locked.

In order to assign the LLR value for a bad bit, the LLR module 1012 may be configured to access a bad bit LLR table 1018. In one implementation, the bad bit table 1018 may include two sets of LLR value information, one for the LLR module 1012 to use when the bad bit value identified in the array is at a logic 1 value, and another LLR value for the LLR module 1012 to use when the bad bit value identified in the array is at a logic 0 value. Like the good bit LLR table 1014, the LLR value information included in the bad bit LLR table 1018 may include at least the M-bit likelihood value component, and in some implementations, may also include the sign bit and/or the locking bit. For implementations where the sign bit and/or the locking bit are not included, the LLR module 1012 may append those bits to the M-bit likelihood value component to generate a complete LLR value. In addition, for some implementations, the M-bit likelihood value component may be the same (i.e., indicate the same likelihood or confidence level) both for when the bad bit value in the array is a logic 1 value and when it is a logic 0 value. For other implementations, the M-bit likelihood value may be different for the logic 1 and logic 0 values in the array.

The following illustrates operation of the LLR module 1012 in an example situation where the LLR module 1012 receives two two-bit representations of scrambled, encoded data during a decoding process. Suppose for the example situation that a first two-bit representation has the logic value "01," where the hard bit is logic 0 and the soft bit is logic 1, and that the second two-bit representation has the logic value "10," where the hard bit is logic 1 and the soft bit is logic 0. Further suppose for the example situation that the bit associated with the first two-bit representation "10" is stored in a good memory element, and that the bit associated with the second two-bit representation "01" is stored in a bad memory element.

The LLR module 1012 may receive the first two-bit representation "01" and in response determine that the bit associated with the first two-bit representation is stored in a good memory element. In response, the LLR module 1012 may access the good bit LLR table 1014, find the entry for the logic value "01," and retrieve the LLR value information associated with that logic value. For some implementations, the LLR value information may include only the M-bit likelihood value component, and so the LLR module 1012 may be configured to append, to the M-bit likelihood value component, a sign bit with a logic 0 value corresponding to the logic 0 value of the hard bit and a locking bit with a logic value (e.g., a logic 0 value) indicating that the LLR value is unlocked since the associated bit is stored in a good memory element. For other implementations, the LLR value information may include the sign bit and/or the locking bit, and so the LLR module 1012 may not have to append the sign bit and/or the locking bit as appropriate. When the LLR value associated with the first two-bit representation "01" is in its completed form, the LLR module 1012 may send the LLR value to the codeword RAM 1016.

Subsequently, the LLR module 1012 may receive the second two-bit representation "10" and in response determine that the bit associated with the second two-bit representation "10" is stored in a bad memory element. In response, the LLR module 1012 may locate, in the bad bit array stored in the bad bit array portion 1022, the bad bit value associated with the second-bit representation "10." Suppose the associated bad bit value has a logic 0 value, indicating the value of the bit as originally written into the memory die was logic 0. The LLR module 1012 may then access the bad bit LLR table 1018 to retrieve LLR value information associated the bad bit value, which in this case is the logic 0 value. The LLR value information may include an M-bit likelihood value component that indicates a relatively high likelihood or confidence level, such as 75% or greater. In one example, the M-bit likelihood value component may indicate a likelihood or confidence level of 100%. So, for example, where M=6, the M-bit likelihood value may be a 6-bit value corresponding to +64 (or $2^6$). For implementations where the LLR value information includes only the M-bit likelihood value component, the LLR module 1012 may append, to the M-bit likelihood value component, a sign bit with a logic 0 value corresponding to the logic 0 value of the bad bit value of the array, and a locking bit with a logic value (e.g., a logic 1 value) indicating that the LLR value is locked since the associated bit is stored in a bad memory element. For other implementations, the LLR value information may include the sign bit and/or the locking bit, and so the LLR module 1012 may not have to append the sign bit and/or the locking bit as appropriate. Regardless of the implementation, the sign bit of the LLR corresponds to the bad bit value in the array (i.e., the correct value), instead of the value of the hard bit of the two-bit representation, which in this situation was incorrect (i.e., it did not match the logic value of the associated bit as it was written). When the LLR value associated with the second two-bit representation "10" is in its completed form, the LLR module 1012 may send the LLR value to the codeword RAM 1016.

The LLR module 1012 may assign LLR values for each of the bits of the scrambled, encoded data in this manner until all of the bits have been assigned LLR values and these LLR values are sent to the codeword RAM 1016. After all of the LLR values are stored in the codeword RAM 1016, the decoder module 1020 may access the LLR values and perform decoding. In one example, the decoder module 1020 may use the parity bits in conjunction with a matrix that represents a set of polynomial equations to achieve convergence.

If convergence is achieved, then the decoder module 1020 may determine that the sign bits of the LLR values are correct, and in turn determine that the scrambled, encoded data is correctly read from the non-volatile memory die 104. Alternatively, if convergence is not achieved (i.e., one or more of the equations are failing), then the decoder module 120 may determine that the sign bit of one or more LLR values is incorrect, and in turn determine that there are errors in the scrambled, encoded data read from the memory die 104. As a result, the decoder module 1020 may determine to flip the sign bit of one or more LLR values and then re-attempt solving the polynomial equations to achieve convergence.

To determine which of the LLR values to select to flip the sign bits, the decoder module 1020 may look to the M-bit likelihood value components. The decoder module 1020 may be more prone to flip sign bits for those LLR values with lower M-bit likelihood value components since they indicate a lower likelihood or confidence level that their sign bits are correct. In addition or alternatively to looking at the values of the M-bit likelihood value components, the decoder module 1020 may look to the locking bit. If the locking bit for a particular LLR value indicates that the LLR value is locked, the decoder module 1020 may deem LLR value as being unavailable to have its sign bit flipped, and as such, avoid flipping the sign bit of that LLR value, regardless or independent of the likelihood or confidence level indicated by the associated M-bit likelihood value component. Conversely, if the locking bit indicates that the LLR value is unlocked, the decoder module 820 may then deem that LLR value as being available to have its sign bit flipped.

As mentioned, LLR values for bad bits may have M-bit likelihood value components that indicate relatively high likelihood or confidence levels and/or may have locking bits that lock these LLR values. In turn, the decoder module 1020 may be less prone and/or be prevented altogether from flipping sign bits for these LLR values in the event that convergence is not achieved. However, because the LLR module 1012 used the array of bad bit values to set the sign bits for these LLR values, the values of the sign bits are correct anyway, and so it is desirable for the decoder module 1020 to avoid flipping the sign bits for these LLR values.

In sum, using the array of bad bit values to set sign bits for associated LLR values may increase the number of LLR values with correct sign bits that the LLR module 1012 sends to the codeword RAM 816. Further, assigning the M-bit likelihood value components of LLR values for bad bits to indicate relatively high likelihood or confidence levels and/or locking these LLR values may help steer away the decoder module 1020 from flipping sign bits it should not be flipping, which in turn may steer the decoder module 1020 toward the LLR values having sign bits it should flip to achieve convergence. Each of these aspects of LLR value generation for bad bits may improve the decoding process performed by the decoder module 1020. As a result, not only may bad memory elements be utilized to store data under these encoding and decoding processes, but the overall error correction process when reading data from the non-volatile memory dies 104 may be enhanced when doing so.

Different variations of the above-described decoding process may be possible. For example, other example implementations may use LLR values that do not include locking bits. Accordingly, for bad bit values, the LLR module 1012 may assign an M-bit likelihood value component that has a relatively high likelihood or confidence level, but does not append a locking bit to the LLR value. For other example implementations, the LLR values may be included, but the M-bit likelihood value component may not necessarily indicate a high likelihood or confidence level. That is, the M-bit likelihood value component may be a "dummy" M-bit value, since the decoder module 1020 will not flip the associated sign bit regardless of the M-bit value.

Additionally, for some example implementations, the controller 102 may not load the array of bad bit values into the RAM 116 unless an uncorrectable error event is triggered during the decoding process. An uncorrectable error event may occur when the number of errors in the scrambled, encoded data is too numerous that the decoder module 1020 is unable to achieve convergence, regardless of how many times it attempts to flip various sign bits. As such, an uncorrectable error event may indicate that the number of errors in the sensed, encoded data read from the memory dies 104 has exceeded a threshold number. Prior to occurrence of an uncorrectable error event, the LLR module 1012 may assume that each of the bits are stored in good memory elements and assign LLR values by accessing LLR value information from the good bit LLR table 1014 for each of the bits. Only after detection of an uncorrectable error event, the array of bad bit values may be loaded into the RAM 116 and the LLR module 1012 check to see whether a bit is stored in a bad memory element and assign LLR values for the bad bits by accessing the bad bit LLR table 818. When an uncorrectable error event occurs, the decode input module 1010 may re-access the scrambled, encoded data in the RAM 116 and pass it once again through the LLR module 1012 to reassign LLR values for bits stored in bad bit locations. This example implementation may reduce the number of times that the array of bad bit values is accessed from the memory dies 104, which may increase the overall endurance or lifespan of the array of bad bit values being stored in its initial storage location (e.g., footer storage space) in the memory dies 104.

Assuming that convergence is achieved, decoding performed by the decoding module 1020 may be complete and the sign bits of the LLR values (some of which may have been changed during decoding) of the payload and header portions may be sent as scrambled, decoded data to a descrambler 1024 to descramble the data in order to format that data into its original, unscrambled form. The scrambler components of the descrambler module 1024 may correspond to those of the scrambler module 512 (FIG. 5). And so, if the scrambler module 512 included an encryption engine, then the descrambler module 1024 may include a corresponding decryption engine. Similarly, if the scrambler module 512 includes a scrambler that used one or more scrambler keys to scramble the data, then the descrambler module 1024 may use those keys to descramble the data.

After the data is descrambled by the descrambler module 1024, the descrambler module 1024 may load the descrambled, decoded data into a descrambled, decoded data portion 1026 of the RAM 116. Thereafter, the controller 102 may be configured to send, using the memory interface 130, the descrambled, decoded data to its final destination, such as to the host requesting the data, in order to complete the read request.

Figure 12:
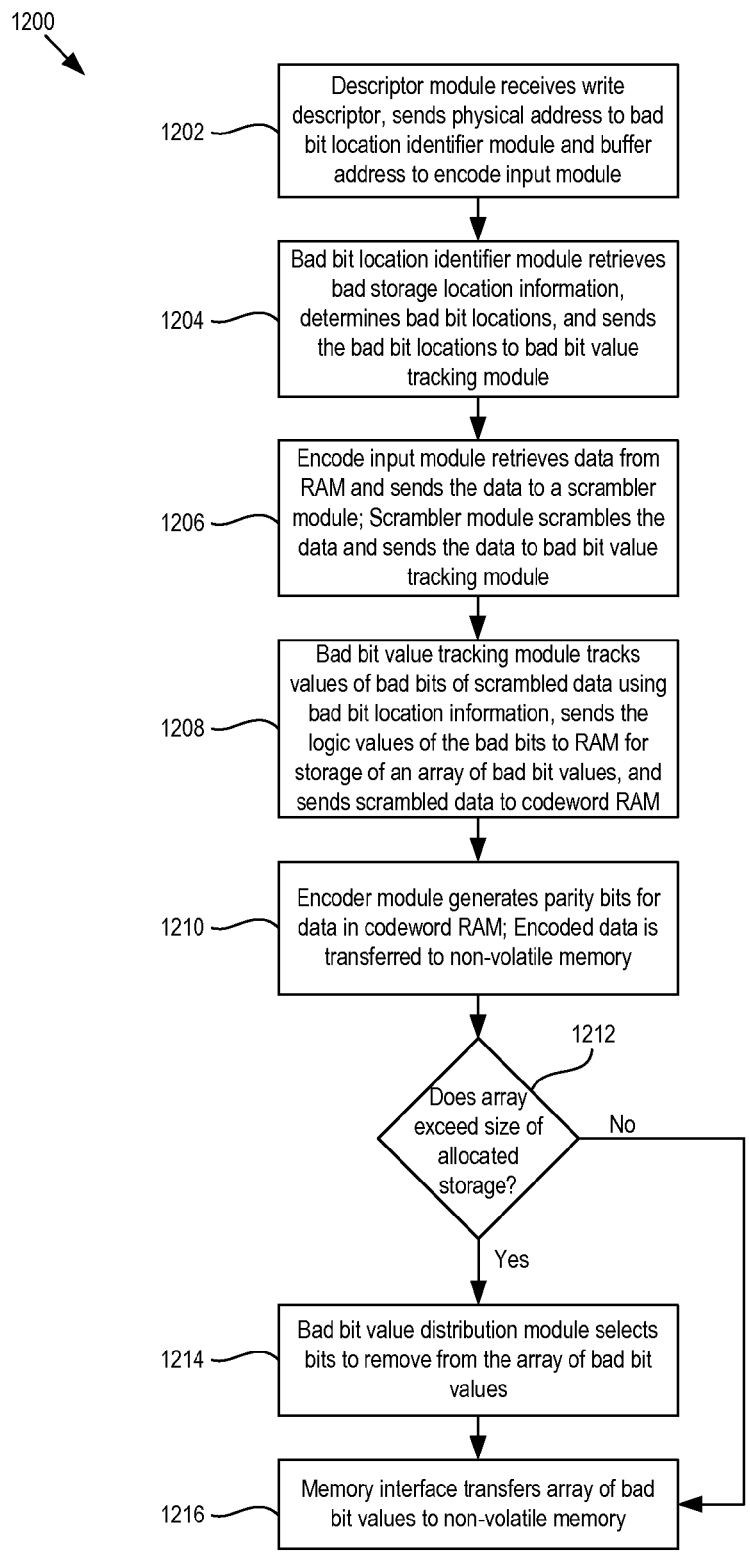
FIG. 12 is a flow chart of an example method of encoding data that includes bits to be stored in memory elements identified as unreliable.

FIG. 12 shows a flow chart of an example method 1200 of a controller encoding dta for storage in non-volatile memory. Although not limited, the method 1200 may be part of a write operation performed by a non-volatile memory system in response to a host write request. At block 1202, a descriptor module may receive a descriptor indicating for the data to be encoded. The descriptor module may send physical address information where the data is to be stored in the non-volatile memory to a bad bit location identifier module and buffer address information where the data is being temporarily stored in RAM to an encode input module. At block 1204, the bad bit location identifier module may retrieve bad storage location information from a database and determine which bits of the data are to be stored in bad memory elements in the non-volatile memory. For some example methods, the database may be stored in a header portion of a block in the non-volatile memory in which the data is to be stored. The bad bit location identifier module may send the bad storage location information to a bad bit value tracking module.

At block 1206, in response to receipt of the buffer address information from the descriptor module, the encode input module may retrieve the data from the RAM and send the data to a scrambler module. The scrambler module may scramble the data by modifying one or more logic values of the bits to generate a random or even distribution of logic 1 and logic 0 values for the data. Upon scrambling the data, the scrambler module may send the scrambled data to a bad bit value tracking module. At block 1208, the bad bit value tracking module may receive the scrambled data and bad bit location information and track the logic values of the bad bits of the data. Upon tracking the logic values of the bad bits, the bad bit value tracking module may send the data to a codeword RAM and the tracked bad bit logic values to a bad bit array portion of the RAM. In the RAM, the bad bit logic values may accumulate as an array or string of bad bit values.

At block 1210, an encoder module may generate parity bits for the scrambled data loaded in the codeword RAM. The parity bits may be added to the data to form an encoded version of the data. The encoded data may be loaded into RAM, and then transferred with a memory interface to the non-volatile memory for storage.

At block 1212, a bad bit value distribution module may determine whether the accumulated number of bad bit values of the array exceeds a size allocated in the non-volatile memory for storage of the bad bit values. If so, then at block 1216, the bad bit value distribution module may select values to remove from the array so that the array meets the size requirements. Where bad bit values are identified on a bad bit line basis, the bad bit value distribution module may select the bit values to remove by selecting bad bit lines to remove from consideration as being bad. The bad bit value distribution module may do so in a way that more evenly distributes the identified bad bit lines horizontally across an area, such as a block, in which the data is to be stored, such as through generation of a histogram as previously described. The bad bit value distribution module may then remove the logic values from the array that are associated with bits to be stored in memory elements coupled to bitlines that the bad bit value distribution module removed from consideration.

After the size of the array has been reduced, then at block 1216, the reduced-size array of bad bit values may be transferred with the memory interface to the non-volatile memory. For some methods, the array may be stored in the block in which the data associated with the bad bit values of the array is stored. In particular methods, the array may be stored in a footer storage area of the block. Referring back to block 1212, if the array of bad bit values does not exceed the allocated storage space, then the method may proceed directly to block 1216.

Figure 13:
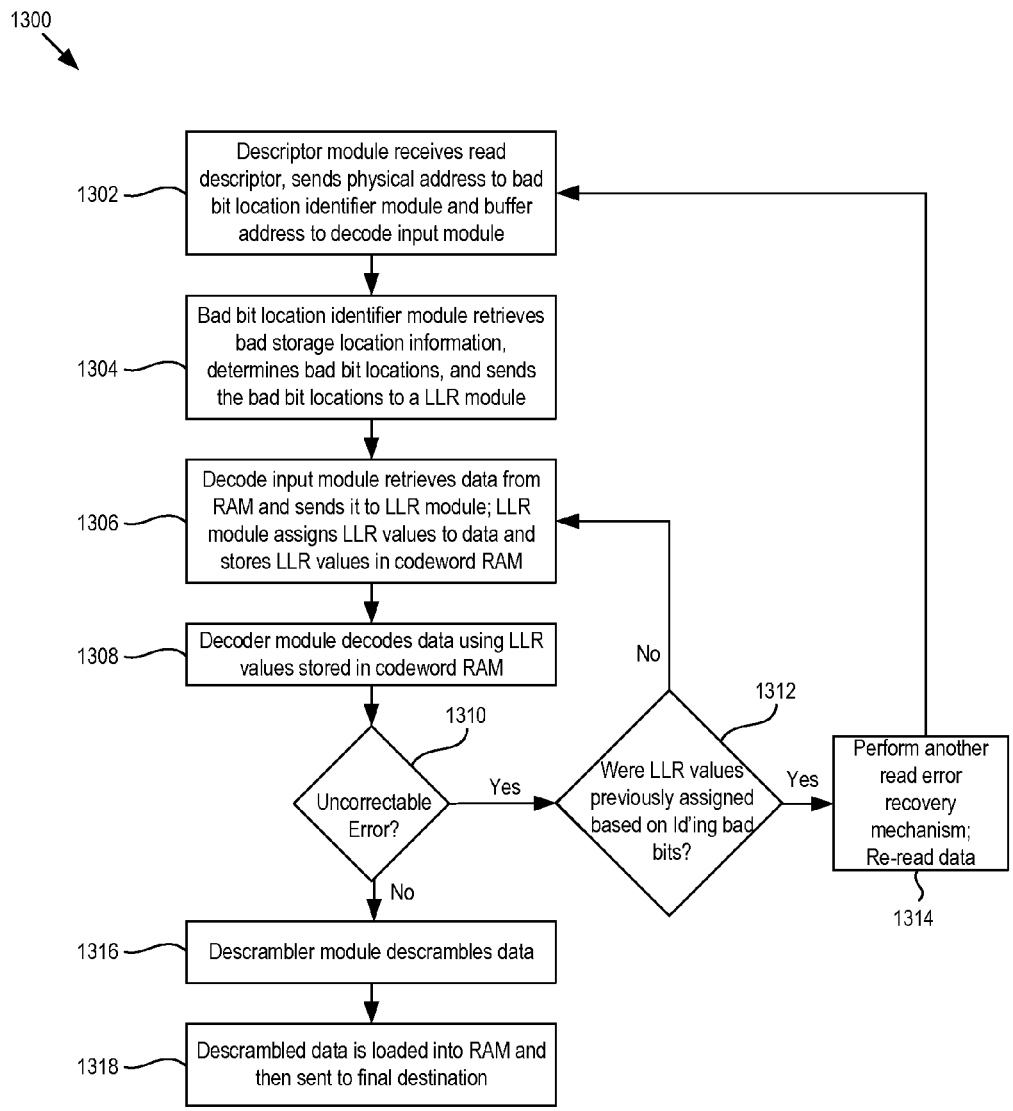
FIG. 13 is a flow chart of an example method of decoding data that includes bits stored in memory elements identified as unreliable.

FIG. 13 shows a flow chart of an example method 1300 of a controller decoding data retrieved from storage in non-volatile memory. Although not limited, the method 1300 may be part of a read operation performed by a non-volatile memory system in response to a host read request. At block 1302, a descriptor module may receive a descriptor indicating for the data to be decoded. The descriptor module may send physical address information where the data is stored in the non-volatile memory to a bad bit location identifier module and buffer address information where the data is stored in RAM to an decode input module. At block 1304, the bad bit location identifier module may retrieve bad storage location information from a database and determine which bits of the data are stored in bad memory elements in the non-volatile memory. The bad bit location identifier module may send the bad storage location information to a LLR module.

At block 1306, the decode input module may retrieve the data from RAM and send the data to the LLR module. The data may be sent to the LLR module as one-bit, two-bit, or three-bit representations of the data stored in the non-volatile memory. The LLR module may assign an LLR value for each of the associated bits. As previously described, the LLR module may determine, for each n-bit representation, whether the associated bit is stored in a good or a bad memory element. If the bit is stored in a good memory element, then the LLR module may access a good bit LLR table and assign a LLR value based on the logic value(s) of the n-bit representation. In addition, for methods that implement locking bits, a locking bit may be set to a value that unlocks the LLR value. Alternatively, if the bit is stored in a bad memory element, then the LLR module may access an array of bad bit values generated when encoding the data to determine the logic value of the associated bit when it was initially programmed into the non-volatile memory. Upon determining the logic value, the LLR module may set a sign bit to correspond to the logic value identified in the array. Additionally, the LLR module may set the M-bit likelihood value component to a relatively high likelihood or confidence level that the sign bit indicates the correct value, such as above 75%. For some methods, the M-bit likelihood value component may indicate a 100% likelihood or confidence level. In addition, for methods that implement locking bits, the LLR module may set a locking bit to a value that locks the LLR value. After assigning a LLR value for a bit, the LLR module may send the LLR value to a codeword RAM.

At block 1308, after LLR values are loaded into the codeword RAM, a decoder module may perform decoding to determine if the sign bits of the LLR values for the header and payload portions are correct and if not, correct any errors. As previously described, the decoder module may do so by using the LLR values to solve polynomial equations to achieve convergence. If the decoder module identifies errors but is unable to correct them (e.g., the number of errors exceeds a threshold number), then the decoder module may identify an uncorrectable read error event. As previously described, the LLR module may distinguish between good bits and bad bits only after an uncorrectable read error event has been detected by the decoder module. Until an uncorrectable read error event is detected, the LLR module may assign LLR values under the assumption that the n-bit representations are all associated with good bits. Accordingly, if an uncorrectable read error is detected at block 1310, then at block 1312, if the LLR module had not previously assigned LLRs value based on distinguishing between good bits and bad bits, the method 1300 may proceed back to block 1306, where the array of bad bit values may be loaded into RAM, the data may be passed back from RAM to the LLR module, and the LLR module may assign LLR values for the bad bits based on the corresponding logic values in the array. Alternatively, if at block 1312 the LLR module has already assigned LLR values based on distinguishing between good bits and bad bits, then at block 1314, a different read error recovery mechanism or scheme may be employed, such as increasing threshold voltage levels of voltages applied to the memory elements to read the data as an example, in order to attempt to reduce the number of errors in the read data. The method 1300 may then proceed back to block 1302, where the decoding process may be repeated using the re-read data.

Referring back to block 1310, if an uncorrectable read error event is not detected, convergence has been reached and the method may proceed to block 1316. At block 1316, a descrambler module may descramble the data to format the data in its original unscrambled form. At block 1318, after the data is descrambled, the data may be loaded into RAM and thereafter sent to its final destination. For example, if the decoding process is performed in response to a host read request, the data may be sent to the host.

Lastly, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A non-volatile memory system comprising:
   non-volatile memory; and
   a controller configured to:
      identify a plurality of memory elements of the non-volatile memory to store data; and
      determine which memory elements of the plurality of memory elements are identified in the non-volatile memory system as unreliable;
      track logic values of bits of the data to be stored in the identified unreliable memory elements; and
      assign log likelihood ratio values to the bits of data stored in the identified unreliable memory elements based on the tracked logic values.

2. The non-volatile memory system of claim 1, wherein the controller is further configured to:
   scramble the data,
   track the logic values of the bits in response to the data being scrambled.

3. The non-volatile memory system of claim 2, wherein the database identifies unreliable bitlines of the non-volatile memory.

4. The non-volatile memory system of claim 2, wherein the database identifies zones of unreliable memory elements, and wherein each zone comprises an identifiable number of memory elements coupled to the same wordline.

5. The non-volatile memory system of claim 2, wherein the controller is configured to store the database in a header portion of a storage area that comprises the plurality of memory elements.

6. The non-volatile memory system of claim 1, further comprising a database that identifies unreliable storage locations in the non-volatile memory, wherein the controller is configured to use information about the unreliable storage locations identified in the database to determine the identified unreliable memory elements.

7. The non-volatile memory system of claim 6, wherein the controller is configured to analyze bitline bitmasks in the database to identify the unreliable bitlines.

8. The non-volatile memory system of claim 1, wherein the controller is further configured to generate parity bits for the data after the tracking module tracks the logic values of the bits of the data to be stored in the identified unreliable memory elements.

9. The non-volatile memory system of claim 1, wherein the tracked logic values comprise an array of logic values, and wherein controller is further configured to:
   determine whether an accumulated number of the tracked logic values exceeds a size of a first storage area of the non-volatile memory allocated to store the tracked logic values; and
   when the accumulated number exceeds the size of the storage area, remove one or more of the tracked logic values from the array based on a distribution of identified unreliable bitlines across a second storage area of the non-volatile memory designated to store the data.

10. The non-volatile memory system of claim 1, wherein the tracked logic values are stored in a footer portion of a storage area that comprises the plurality of memory elements.

11. The non-volatile memory system of claim 1, wherein the controller is configured to set sign bits for the log likelihood ratio values to correspond to the tracked logic values.

12. The non-volatile memory system of claim 1, wherein the controller is configured to set likelihood value components for the log likelihood ratio values to indicate greater than a 75% likelihood.

13. The non-volatile memory system of claim 12, wherein the controller is configured to set at least some of the likelihood value components to indicate a 100% likelihood.

14. The non-volatile memory system of claim 1, wherein the controller is configured to lock the log likelihood ratio values to prevent adjustment of the log likelihood ratio values.

15. The non-volatile memory system of claim 1, wherein the bits of the data stored in the identified unreliable memory elements comprise first bits, wherein the log likelihood ratio values comprise a first set of log likelihood ratio values, and wherein the controller is configured to assign a second set of log likelihood ratio values to second bits of the data, wherein the second bits are stored in identified reliable memory elements, and wherein the second set of log likelihood ratio values are assigned based on logic values of bit representations associated with the second bits.

16. The non-volatile memory system of claim 1, wherein the controller is configured to assign the log likelihood ratio to the bits stored in the identified unreliable memory elements upon detection of an uncorrectable error event, and
   when no uncorrectable error event is detected, the controller is configured to assign the log likelihood ratio values to the bits based on logic values of bit representations associated with the bits.

17. A method of decoding data stored in non-volatile memory of a non-volatile memory system, the method comprising:

identifying, with a controller of the non-volatile memory system, a plurality of bit representations associated with the data stored in the non-volatile memory; and in response to receiving the plurality of bit representations, assigning, with the controller, log likelihood ratio values for bits of the associated data identified as stored in unreliable memory elements of the non-volatile memory based on a record identifying logic values at which the associated bits were programmed into the non-volatile memory; and storing, with the controller, the log likelihood ratio values in memory.

18. The method of claim 17, further comprising:
retrieving, with the controller, the record from a footer portion of a storage area storing the associated data to assign the log likelihood ratio values.

19. The method of claim 17, wherein assigning the log likelihood ratio values comprises setting, with the controller, sign bits for the log likelihood ratio values to correspond to the logic values identified in the record.

20. The method of claim 17, wherein assigning the log likelihood ratio values comprises setting, with the controller, likelihood value components for the log likelihood ratio values to indicate greater than a 75% likelihood.

21. The method of claim 20, wherein at least some of the likelihood value components indicate a 100% likelihood.

22. The method of claim 17, wherein assigning the log likelihood ratio values comprises setting, with the controller, locking bits of the log likelihood ratio values to a value that locks the log likelihood ratio values, wherein the controller is prevented from adjusting the locked log likelihood ratio values during the method of decoding.

23. The method of claim 17, wherein the associated bits of the data stored in the identified unreliable memory elements comprise a first set of associated bits, wherein the log likelihood ratio values comprise a first set of log likelihood values, the method further comprising:
assigning, with the controller, a second set of log likelihood ratio values for a second set of bits with which the plurality of bit representations are associated based on logic values of the bit representations, wherein the second set of bits are stored in identified reliable memory elements.

24. The method of claim 17, wherein assigning the log likelihood ratio values for the bits comprises assigning, with the controller, the log likelihood ratio values for the bits identified as stored in the unreliable memory elements based on the record upon detection of an uncorrectable error event, and
when no uncorrectable error event is detected, assigning, with the controller, the log likelihood values for the bits based on logic values of the plurality of the bit representations.

25. The method of claim 24, further comprising:
retrieving, with the controller, the record to assign the log likelihood ratio values in response to detection of the uncorrectable error event.

26. A non-volatile memory system comprising:
non-volatile memory; and
means for determining which memory elements of a plurality of memory elements in the non-volatile memory are identified as unreliable;
means for tracking logic values of data to be stored in the identified unreliable memory elements; and
means for assigning log likelihood ratio values to the data stored in the identified unreliable memory based on the tracked logic values of the data.

* * * * *